(12) United States Patent
Ryu

(10) Patent No.: US 12,520,705 B2
(45) Date of Patent: Jan. 6, 2026

(54) DISPLAY DEVICE INCLUDING BENDING PROTECTION LAYER, AND METHOD THEREOF

(71) Applicant: Samsung Display Co., Ltd., Yongin-si (KR)

(72) Inventor: Suchang Ryu, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 437 days.

(21) Appl. No.: 18/099,007

(22) Filed: Jan. 19, 2023

(65) Prior Publication Data
US 2023/0413648 A1    Dec. 21, 2023

(30) Foreign Application Priority Data

May 27, 2022 (KR) .................. 10-2022-0065129

(51) Int. Cl.
*H10K 59/80* (2023.01)
*H10K 59/12* (2023.01)
*H10K 102/00* (2023.01)

(52) U.S. Cl.
CPC ....... *H10K 59/873* (2023.02); *H10K 59/1201* (2023.02); *H10K 59/12* (2023.02); *H10K 2102/311* (2023.02)

(58) Field of Classification Search
CPC .. H10K 59/873; H10K 59/1201; H10K 59/12; H10K 2102/311; H10K 77/111; H10K 50/8426; H10K 50/844; H10K 50/87; H10K 59/131; H10K 59/40; H10K 71/00; Y02E 10/549; G09F 9/301
See application file for complete search history.

(56) References Cited

U.S. PATENT DOCUMENTS

| | | | |
|---|---|---|---|
| 10,586,941 B2 | 3/2020 | Lee et al. | |
| 2019/0305234 A1* | 10/2019 | Jung | H10K 59/87 |
| 2020/0203641 A1* | 6/2020 | Lee | G02F 1/133305 |
| 2020/0285338 A1* | 9/2020 | Eom | G06F 3/0445 |
| 2020/0328375 A1* | 10/2020 | Won | H10K 50/86 |
| 2021/0005690 A1* | 1/2021 | Lee | G06F 3/0446 |
| 2023/0095650 A1* | 3/2023 | He | H10K 71/00 |
| | | | 257/40 |
| 2023/0101087 A1* | 3/2023 | Li | G06F 1/1643 |
| | | | 257/40 |
| 2024/0049558 A1* | 2/2024 | Zhan | H10K 59/8791 |

FOREIGN PATENT DOCUMENTS

KR    1020170084402 A    7/2017

* cited by examiner

*Primary Examiner* — J.E. Schoenholtz
(74) *Attorney, Agent, or Firm* — CANTOR COLBURN LLP

(57) ABSTRACT

A display device includes a display panel including a first region, a second region, and a bending region disposed between the first region and the second region and having a predetermined radius of curvature, an adhesive layer disposed on the display panel and overlapping the first region when viewed on a plane, a functional layer disposed on the adhesive layer and overlapping the first region when viewed on a plane; and a bending protection layer disposed on the display panel and overlapping the bending region when viewed on a plane, wherein at least a portion of the adhesive layer is in contact with the bending protection layer, and the functional layer is spaced apart from the bending protection layer, thereby exhibiting increased reliability.

29 Claims, 25 Drawing Sheets

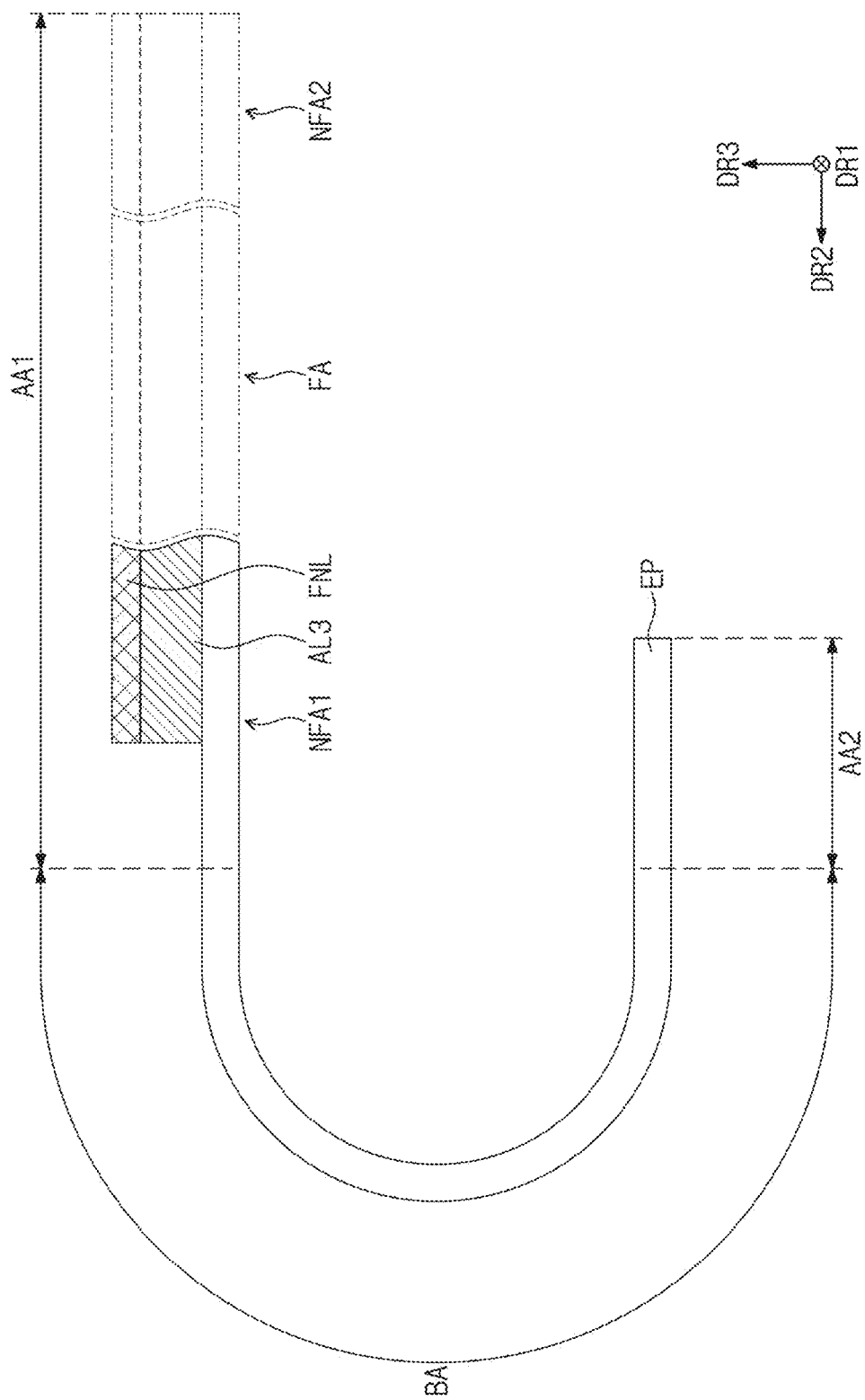

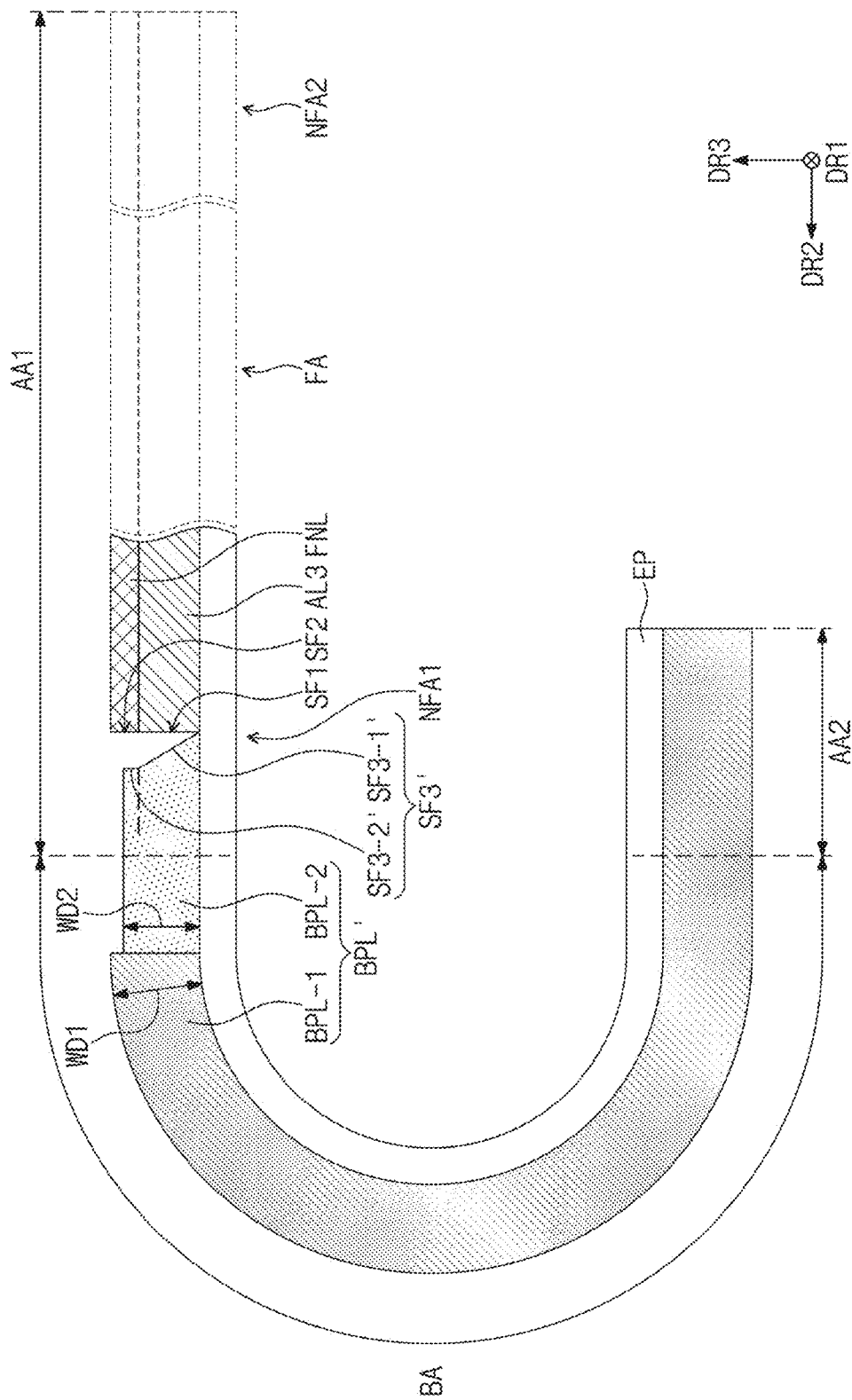

DISPLAY DEVICE INCLUDING BENDING PROTECTION LAYER, AND METHOD THEREOF

This U.S. non-provisional patent application claims priority to Korean Patent Application No. 10-2022-0065129, filed on May 27, 2022, and all the benefits accruing therefrom under 35 U.S.C. § 119, the entire contents of which are hereby incorporated by reference.

BACKGROUND

(1) Field

The present disclosure herein relates to a display device and a method for manufacturing (or providing) the same. More particularly, the present disclosure herein relates to a foldable display device and a method for manufacturing (or providing) the same.

(2) Description of the Related Art

Along with the advancement of display devices, various forms of display devices are under development. For example, various flexible display devices configured to be curvedly deformed, folded, or rolled have been developed. The flexible display devices may be highly portable and more user friendly.

When the flexible display devices are folded or rolled, components included in the flexible display devices may also be folded or rolled. Thus, research is being conducted to prevent defects to the components embedded in the display devices from being caused, for example, due to friction between components during folding or rolling of a flexible display device.

SUMMARY

The present disclosure provides a display device having increased durability at a bending portion.

The present disclosure also provides a method for manufacturing (or providing) a display device having increased reliability.

An embodiment of the invention provides a display device including a display panel including a first region, a second region, and a bending region disposed between the first region and the second region and having a predetermined radius of curvature, an adhesive layer disposed on the display panel and overlapping the first region when viewed on a plane, a functional layer disposed on the adhesive layer and overlapping the first region when viewed on a plane, and a bending protection layer disposed on the display panel and overlapping the bending region when viewed on a plane. A portion of the adhesive layer is in contact with the bending protection layer, and the functional layer is spaced apart from the bending protection layer.

In an embodiment, the adhesive layer may include a first side surface, the functional layer may include a second side surface, the bending protection layer may include a third side surface including a 3-1 side surface facing the first side surface and a 3-2 side surface facing the second side surface. The shape of the second side surface may be aligned with the shape of the 3-2 side surface.

In an embodiment, the 3-1 side surface may include an inclined surface forming an inclination angle with one surface of the display panel, and the inclination angle may be greater than 0 degrees (°) and less than about 90°.

In an embodiment, the first region may include a first non-folding region, a second non-folding region, and a folding region disposed between the first non-folding region and the second non-folding region. The display device which is folded at the folding region, with respect to a folding axis, may dispose the first side surface aligned with the 3-1 side surface, and the second side surface aligned with the 3-2 side surface.

In an embodiment, the display panel may include a base layer, a circuit layer disposed on the base layer, and a light emitting element layer disposed on the circuit layer, and the adhesive layer and the functional layer may be disposed on the light emitting element layer.

In an embodiment, the display device may further include an input sensor disposed between the display panel and the adhesive layer.

In an embodiment, the functional layer may be an anti-reflection layer.

In an embodiment, the functional layer may be a shock absorbing layer.

In an embodiment, the display device may further include a window disposed on the functional layer.

In an embodiment, the display panel may include a base layer, a circuit layer disposed below the base layer, and a light emitting element layer disposed below the circuit layer, and the adhesive layer and the functional layer may be disposed on the base layer.

In an embodiment, the functional layer may be a panel protection layer.

In an embodiment, the display device may further include at least one of a cover layer, a support plate, a digitizer, and a heat dissipation layer, and may further include a support portion disposed below the functional layer.

In an embodiment, the display panel may further include pixels overlapping the first region when viewed on a plane, and a driver overlapping the second region when viewed on a plane and connected to the pixels.

In an embodiment of the invention, a display device includes a display panel including a first region, a second region, and a bending region disposed between the first region and the second region and having a predetermined radius of curvature, a functional layer disposed on the display panel and overlapping the first region when viewed on a plane, and a bending protection layer disposed on the display panel and overlapping the bending region when viewed on a plane, where the functional layer includes a functional layer side surface facing the bending protection layer, the bending protection layer includes a bending protection layer side surface facing the functional layer side surface, the first region operates in any one of a folding mode which enables folding with respect to a folding axis and a non-folding mode which enables unfolding to be flat, in the folding mode, the bending protection layer side surface is aligned with the functional layer side surface, in the non-folding mode, the bending protection layer side surface is spaced apart from the functional layer side surface, and the shape of the bending protection layer side surface is aligned with the shape of the functional layer side surface.

In an embodiment, the display device may further include an adhesive layer disposed between the display panel and the functional layer, where the adhesive layer may include an adhesive layer side surface facing the bending protection layer side surface, and in each of the folding mode and the non-folding mode, the adhesive layer side surface may be in contact with the bending protection layer side surface.

In an embodiment, the adhesive layer side surface may include an inclined surface.

In an embodiment of the invention, a method for manufacturing (or providing) a display device includes providing a display panel including a first region, a second region, and a bending region disposed between the first region and the second region and having a predetermined radius of curvature, providing an adhesive layer onto the display panel to overlap the first region when viewed on a plane, providing a functional layer onto the adhesive layer to overlap the first region when viewed on a plane, folding the first region with respect to a folding axis to make the adhesive layer and the functional layer slip in a first direction that is a direction of the bending region, providing a bending protection resin onto a side surface of the adhesive layer that has slipped and a side surface of the functional layer that has slipped and curing the bending protection resin to form (or provide) a bending protection cured product, and non-folding the first region to move the adhesive layer and the functional layer in a second direction opposite to the first direction and form a bending protection layer.

In an embodiment, in the forming of a bending protection layer, the functional layer may be spaced apart from the bending protection layer, and the adhesive layer may be in contact with at least a portion of the bending protection layer.

In an embodiment, the forming of a bending protection cured product may be providing and curing a bending protection resin from a side surface of the adhesive layer that has slipped and a side surface of the functional layer that has slipped to at least a portion of the second region through the bending region on the display panel.

In an embodiment, the method may further include forming a pre-cured product between the providing of a functional layer and the folding, where the forming of a pre-cured product may be providing a pre-resin having a higher modulus than the bending protection resin to the bending region and the second region and curing the pre-resin, and the forming of a bending protection cured product may be providing and curing the bending protection resin from the side surface of the adhesive layer that has slipped and the side surface of the functional layer that has slipped to a side surface of the pre-cured product.

In an embodiment, the bending protection cured product may have a smaller thickness than the pre-cured product.

In an embodiment, the functional layer may be any one among an anti-reflection layer, a shock absorbing layer, and a panel protection layer.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings:

FIGS. 14A to 14E are views schematically showing some of the processes of a method for manufacturing a display device according to an embodiment;

FIGS. 16A to 16E are views schematically showing some of the processes of a method for manufacturing a display device according to an embodiment.

DETAILED DESCRIPTION

Figure 1:
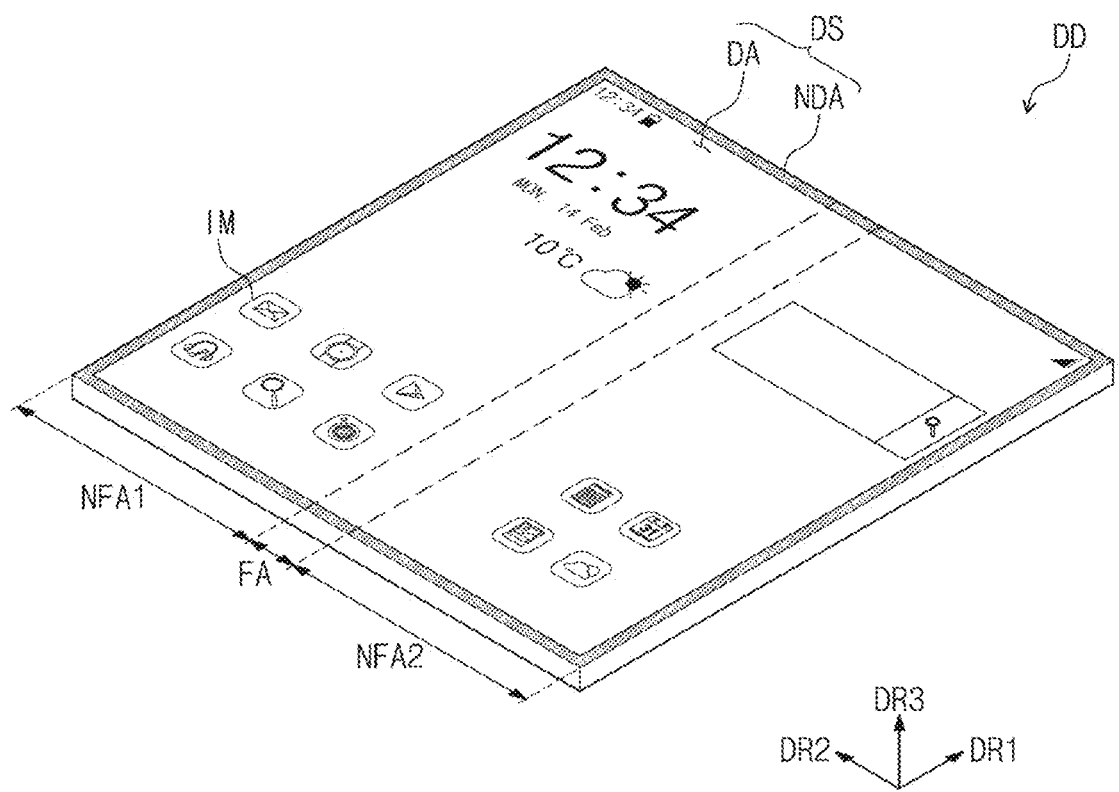
FIG. 1 is a perspective view of a display device according to an embodiment.

The present disclosure may be modified in many alternate forms, and thus specific embodiments will be exemplified in the drawings and described in detail. It should be understood, however, that it is not intended to limit the present disclosure to the particular forms disclosed, but rather, is intended to cover all modifications, equivalents, and alternatives falling within the spirit and scope of the present disclosure.

In the present description, when an element (or a region, a layer, a portion, etc.) is referred to as being related to another element such as being "on," "connected to," or "coupled to" another element, it means that the element may be directly disposed on/connected to/coupled to the other element, or that a third element may be disposed therebetween. In the present description, when an element (or a region, a layer, a portion, etc.) is referred to as being related to another element such as being "directly disposed" may indicate that there is no layer, film, region, plate or the like added between a portion of a layer, a film, a region, a plate or the like and other portions. For example, "directly disposed" may indicate disposing without additional members such as an adhesive member between two layers or two members. As being "directly" related, elements may contact each other, such as to form an interface therebetween.

Like reference numerals refer to like elements. As used herein, a reference number may indicate a singular element or a plurality of the element. For example, a reference number labeling a singular form of an element within the drawing figures may be used to reference a plurality of the singular element within the text of specification.

In addition, in the drawings, the thickness, the ratio, and the dimensions of elements are exaggerated for an effective description of technical contents. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or," includes all combinations of one or more of which associated configurations may define.

It will be understood that, although the terms first, second, 3-1 3-2, 6-1, 6-2, etc. may be used herein to describe various elements, these elements should not be limited by these terms. These terms are only used to distinguish one element from another element. For example, a first element (or 3-1 element) may be referred to as a second element, and similarly, a second element (or 3-2 element) may be referred to as a first element without departing from the teachings of the present disclosure. The singular forms are intended to include the plural forms as well, unless the context clearly indicates otherwise.

Also, terms of "below", "on lower side", "above", "on upper side", or the like may be used to describe the relationships of the components illustrated in the drawings. The terms are used as a relative concept and are described with reference to the direction indicated in the drawings. In the specification, being "disposed on" may represent not only being disposed on the top surface but also being disposed on the bottom surface.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which the present disclosure belongs. In addition, terms, such as those defined in commonly used dictionaries, should be interpreted as having a meaning that is consistent with their meaning in the context of the relevant art and should not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a display device DD according to an embodiment of the invention will be described with reference to the accompanying drawings.

Figure 2:
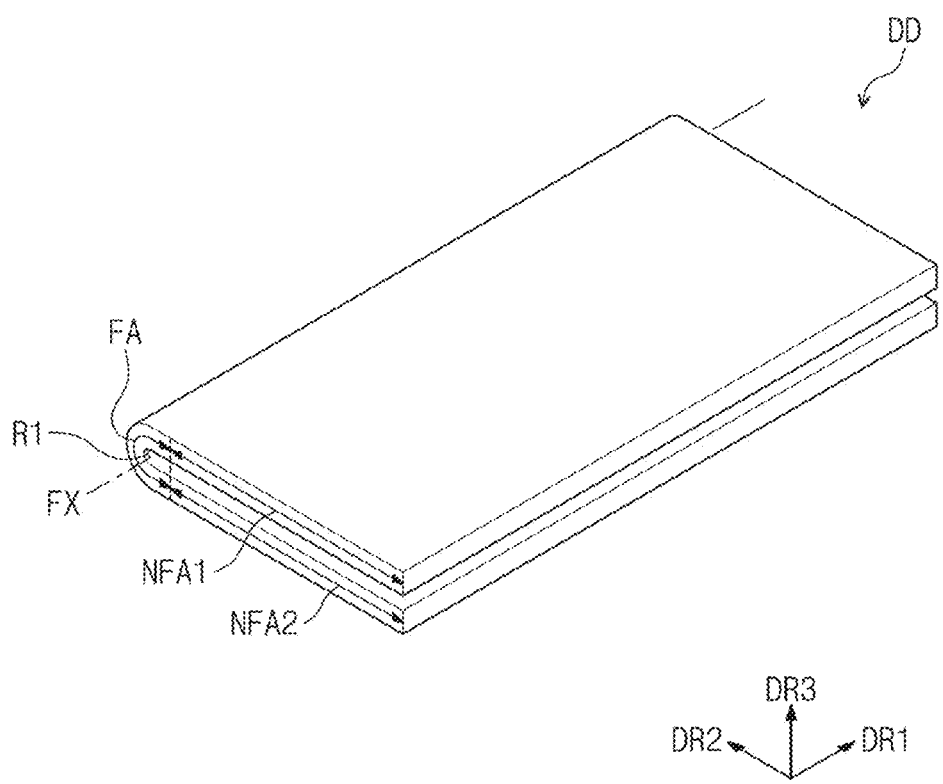
FIG. 2 is a view showing a state in which the display device of FIG. 1 is folded.
Figure 3:
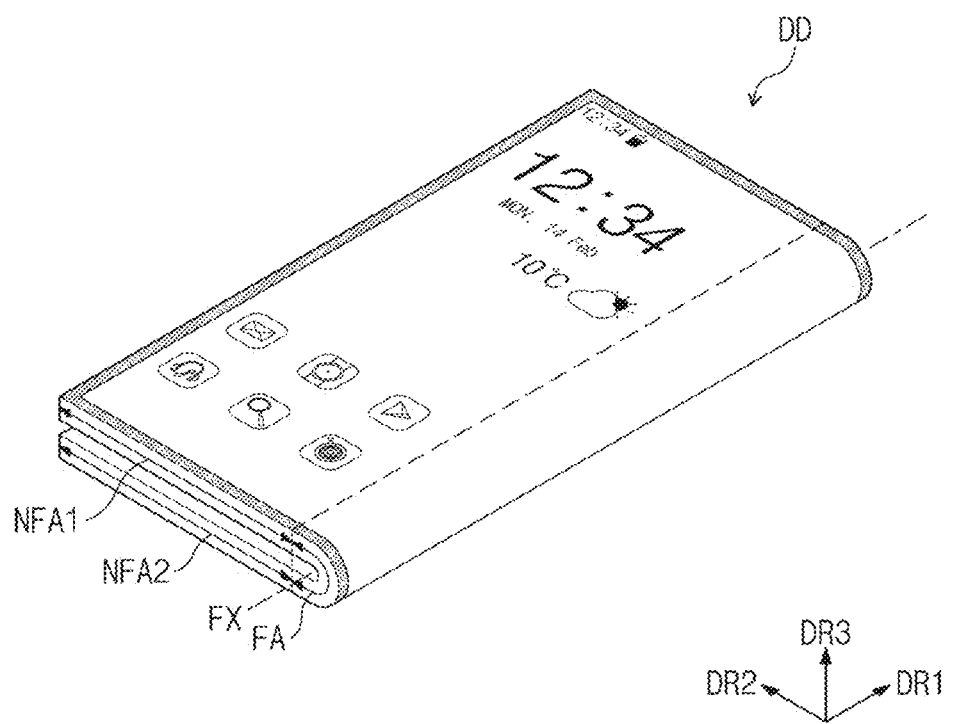
FIG. 3 is a view showing a state in which the display device of FIG. 1 is folded.

FIG. 1 is a perspective view of a display device DD according to an embodiment. FIG. 2 is a view showing a state in which the display device DD of FIG. 1 is folded (e.g., a display device DD which is folded). FIG. 3 is a view showing a state in which the display device DD of FIG. 1 is folded.

A display device DD of an embodiment shown in FIGS. 1 and 3 may be a device activated, operated or driven, according to electrical signals. For example, the display device DD may be a mobile phone, a tablet, a car navigation system, a game console, or a wearable device, but the embodiment is not limited thereto. In FIG. 1, as an example, a mobile phone is presented as the display device DD.

Referring to FIG. 1, the display device DD according to an embodiment of the invention may have a rectangular shape which has two long sides extending in a first direction DR1, and has two short sides extending in a second direction DR2 crossing the first direction DR1. However, the embodiment of the invention is not limited thereto, and the display device DD may have various shapes such as a circular shape and a polygonal shape. The display device DD which is flat (or unfolded) may be disposed in a plane defined by the first direction DR1 and the second direction DR2 crossing each other.

Hereinafter, a direction substantially perpendicularly crossing a plane defined by the first direction DR1 and the second direction DR2 crossing each other, is defined as a third direction DR3. In addition, in the present disclosure, "when viewed on a plane" may be defined as a state viewed in the third direction DR3. A thickness of the display device DD and various components and layers thereof, may be defined along the third direction DR3 (e.g., a thickness direction).

A thickness direction of the display device DD may be parallel to the third direction DR3 which is a normal direction relative to a plane defined by the first direction DR1 and the second direction DR2. As described herein, a front surface (or an upper surface) and a rear surface (or a lower surface) of members constituting the display device DD may be defined with respect to the third direction DR3. As described herein, "thickness" may indicate a numerical value measured in the third direction DR3, and "length," "width," etc. may indicate a numerical value measured in the first direction DR1 and/or the second direction DR2, which is a horizontal direction.

The display device DD according to an embodiment may include a flat display surface DS. Images IM generated in the display device DD may be provided to outside the display device DD, such as to users, through the display surface DS. The display surface DS may be disposed in a plane defined by the first direction DR1 and the second direction DR2. However, the embodiment of the invention is not limited thereto, and the display surface DS may further include a curved surface which is bent from at least one side of the plane defined by the first direction DR1 and the second direction DR2.

The display surface DS may include a display region DA and a non-display region NDA which is adjacent to the display region DA, such as being around the display region DA. The display region DA may display images IM, and the non-display region NDA may not display images IM. The non-display region NDA may surround the display region DA in the plan view. However, the embodiment of the invention is not limited thereto, and the planar shape of the display region DA and the planar shape of the non-display region NDA may be modified. Alternatively, the non-display region NDA may be omitted.

Referring to FIGS. 1 to 3, the display device DD according to an embodiment may be a foldable display device.

The display device DD may include a folding region FA and a non-folding region provided in plural including a plurality of non-folding regions NFA1 and NFA2. For example, the non-folding regions NFA1 and NFA2 may include a first non-folding region NFA1 and a second non-folding region NFA2. The folding region FA may be disposed between the first non-folding region NFA1 and the second non-folding region NFA2. The folding region FA, the first non-folding region NFA1, and the second non-folding region NFA2 may be arranged in the second direction DR2. As an example, one folding region FA and two non-folding regions NFA1 and NFA2 are shown, but the number of the folding region FA and the non-folding regions NFA1 and NFA2 is not limited thereto. For example, the display device DD may include a plurality of non-folding regions which are more than two, and a plurality of folding regions respectively disposed between the non-folding regions. Various components or layers of the display device DD may include a display region DA, a non-display region NDA, a folding region FA, a non-folding region, etc. corresponding to those described above. Various components or layers of the display device DD may be foldable and unfoldable together, in folding and unfolding of the display device DD.

As shown in FIG. 2, the display device DD may be foldable at the folding region FA, with respect to a folding axis FX parallel to the second direction DR2. The folding region FA within the display device DD which is folded, has a predetermined curvature and a predetermined radius of curvature R1. The first non-folding region NFA1 and the second non-folding region NFA2 face each other. The display device DD may be inner-folded (e.g., in-folded) such that portions of the display surface DS face each other and are not exposed to the outside (e.g., outside of the display device DD).

As shown in FIG. 3, the display device DD may be outer-folded (e.g., out-folded) at the folding region FA, such that portions of the display surface DS face in different directions from each other and are exposed to the outside, with respect to a folding axis FX parallel to the second direction DR2.

In an embodiment of the invention, the display devices DD may be configured such that an inner-folding operation or an outer-folding operation is mutually repeated, relative to an unfolding operation where the display device DD is flat, but the embodiment is not limited thereto. In an embodiment of the invention, the display devices DD may be configured to select any one of an unfolding operation, an inner-folding operation, or an outer-folding operation.

Figure 4:
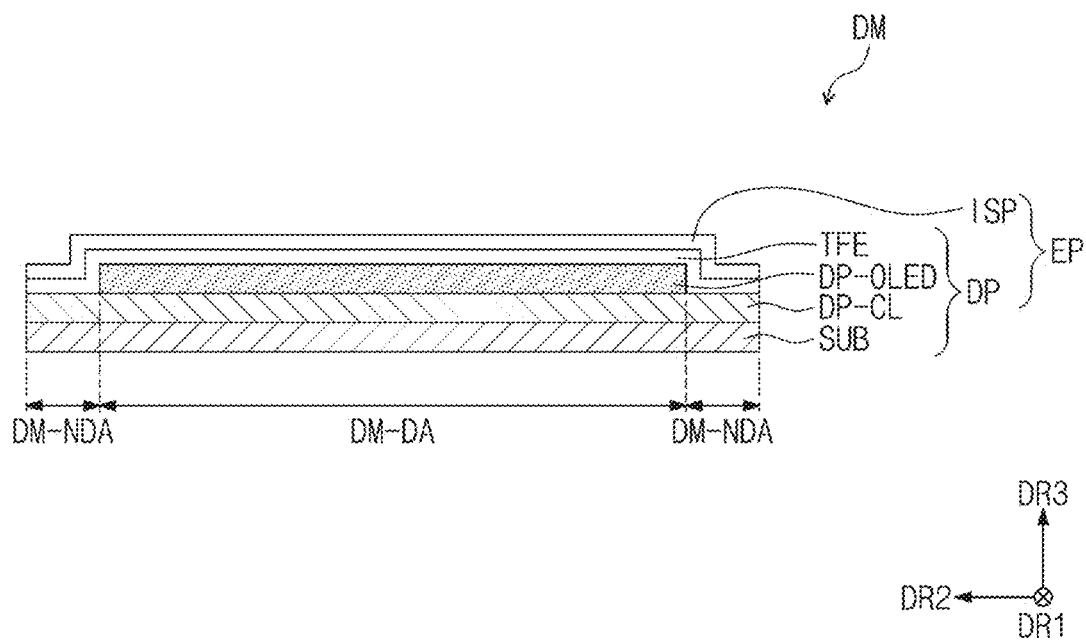
FIG. 4 is a cross-sectional view of a display module according to an embodiment.

FIG. 4 is a cross-sectional view of a display module DM according to an embodiment. The display device DD may include the display module DM.

Referring to FIG. 4, the display module DM according to an embodiment may include an electronic panel EP. The electronic panel EP may include a display panel DP and an input sensor ISP which is disposed on the display panel DP. The display panel DP may include a base layer SUB, a circuit layer DP-CL disposed on the base layer SUB, a light emitting element layer DP-OLED disposed on the circuit layer DP-CL, and a thin film encapsulation layer TFE (e.g., an encapsulation layer) disposed on the light emitting element layer DP-OLED.

The display panel DP according to an embodiment of the invention may be a light emitting display panel, and is not particularly limited. For example, the display panel DP may be an organic light emitting display panel or an inorganic light emitting display panel. An emission layer of the organic light emitting display panel may include an organic light emitting material. An emission layer of the inorganic light emitting display panel may include quantum dots, quantum rods, etc. In addition, an emission layer of the display panel DP may include a micro light emitting diode (LED) element and/or a nano LED element. Hereinafter, the display panel DP is described as an organic light emitting display panel.

In the display panel DP, the base layer SUB may be a member providing a base surface in which the light emitting element layer DP-OLED is disposed. The base layer SUB may be a glass substrate, a metal substrate, a polymer substrate, or the like. However, the embodiment of the invention is not limited thereto, and the base layer SUB may be an inorganic layer, a functional layer, or a composite material layer.

The base layer SUB may have a multilayer structure. For example, the base layer SUB may have a three-layer structure of a polymer resin layer, an adhesive layer, and a polymer resin layer. In particular, the polymer resin layer may include a polyimide-based resin. In addition, the polymer resin layer may include at least one of an acrylic resin, a methacrylic resin, a polyisoprene-based resin, a vinyl-based resin, an epoxy-based resin, a urethane-based resin, a cellulose-based resin, a siloxane-based resin, a polyamide-based resin, or a perylene-based resin. As described herein, a "~~based" resin may be considered as including a functional group of "~~".

The circuit layer DP-CL may include an organic layer, an inorganic layer, a semiconductor pattern, a conductive pattern, a signal line, and the like. An organic layer, an inorganic layer, a semiconductor layer, and a conductive layer may be formed on the base layer SUB through a method such as coating and deposition. Thereafter, the organic layer, the inorganic layer, the semiconductor layer, and the conductive layer may be selectively patterned through multiple times of a photolithography process to form a semiconductor pattern, a conductive pattern, and a signal line.

The semiconductor pattern, the conductive pattern, and the signal line may variously form a pixel driving circuit and signal lines SL1 to SLm, DL1 to DLn, EL1 to ELm, CSL1, CSL2, and PL, of pixels PX (see FIG. 6), which will be described later. The pixel driving circuit may include at least one transistor.

Figure 6:
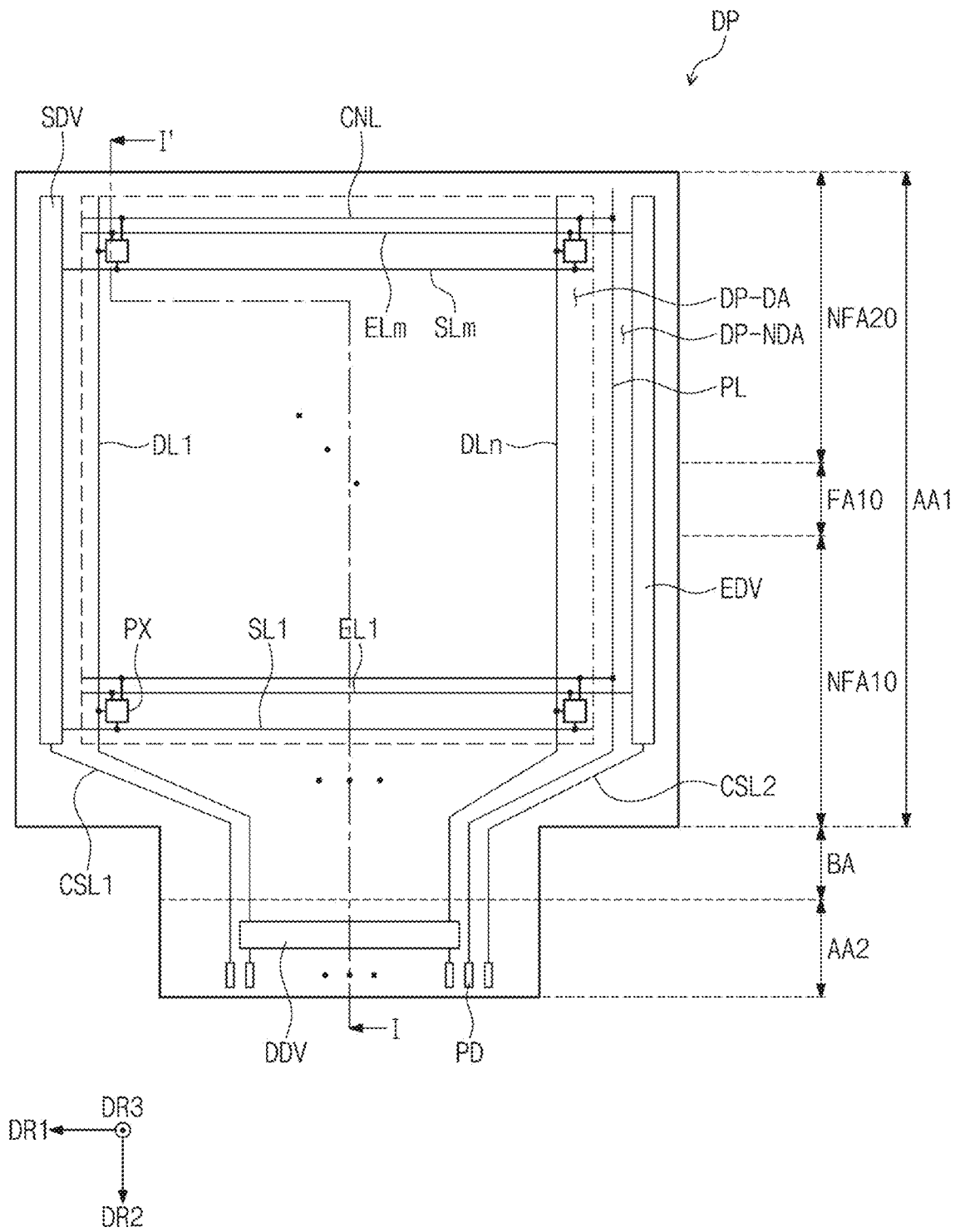
FIG. 6 is a plan view of a display panel according to an embodiment.

The light emitting element layer DP-OLED includes a light emitting element of the pixels PX (see FIG. 6). The light emitting element is electrically connected to the at least one transistor of the circuit layer DP-CL. In addition, the light emitting element layer DP-OLED may further include at least one of an organic layer or an inorganic layer.

The thin film encapsulation layer TFE may be disposed on the circuit layer DP-CL to cover the light emitting element layer DP-OLED. The thin film encapsulation layer TFE may serve to protect light emitting elements from moisture/oxygen, and foreign substances such as dust particles. The thin film encapsulation layer TFE may include an inorganic layer, an organic layer, and an inorganic layer, which are sequentially stacked. The stack structure of the thin film encapsulation layer TFE is not particularly limited.

A display region DM-DA and a non-display region DM-NDA are defined in the display module DM. The display region DM-DA and the non-display region DM-NDA of the display module DM correspond to the display region DA and the non-display region NDA of the display device DD (see FIG. 1), respectively. As described herein, "a region/portion corresponds to another region/portion" indicates that the regions/portions overlap each other, such as being aligned with each other along the thickness direction, but they are not limited to having the same size of area.

The pixel driving circuit of the circuit layer DP-CL is disposed in the display region DM-DA. In addition, some of the signal lines SL1 to SLm, DL1 to DLn, EL1 to ELm, CSL1, CSL2, and PL of the circuit layer DP-CL are disposed in the display region DM-DA and the non-display region DM-NDA.

A light emitting element of the light emitting element layer DP-OLED is disposed in the display region DM-DA. The thin film encapsulation layer TFE is disposed in the display region DM-DA and in the non-display region DM-NDA. However, the thin film encapsulation layer TFE may be sufficient enough to cover the display region DM-DA and may not fully cover the non-display region DM-NDA.

The input sensor ISP may include a plurality of electrodes (not shown) for sensing external inputs to the display device DD and/or the display module DM, trace lines (not shown) connected to the plurality of electrodes, and an organic layer and/or an inorganic layer for insulating/protecting the plurality of electrodes or trace lines. The input sensor ISP may be a capacitance sensor, but is not particularly limited thereto.

The input sensor ISP may be directly disposed on the thin film encapsulation layer TFE through a roll-to-roll process, when manufacturing (or providing) the display module DM. That is, a separate adhesive member may not be disposed between the thin film encapsulation layer TFE and the input sensor ISP. However, the embodiment of the invention is not limited thereto, and the input sensor ISP may be manufactured as a separate panel from the display module DM, and be bonded to the display module DM by an additional adhesive layer.

Although not shown in FIG. 4, the display module DM may further include a functional layer FNL (see FIG. 7) disposed on the electronic panel EP. The functional layer FNL may be an anti-reflection layer or a shock absorbing layer. The functional layer FNL may be separately manufactured or provided as a panel, disposed on the electronic panel EP, and bonded to the electronic panel EP by an adhesive layer. Relevant descriptions are presented later in detail with reference to FIG. 7.

Figure 5:
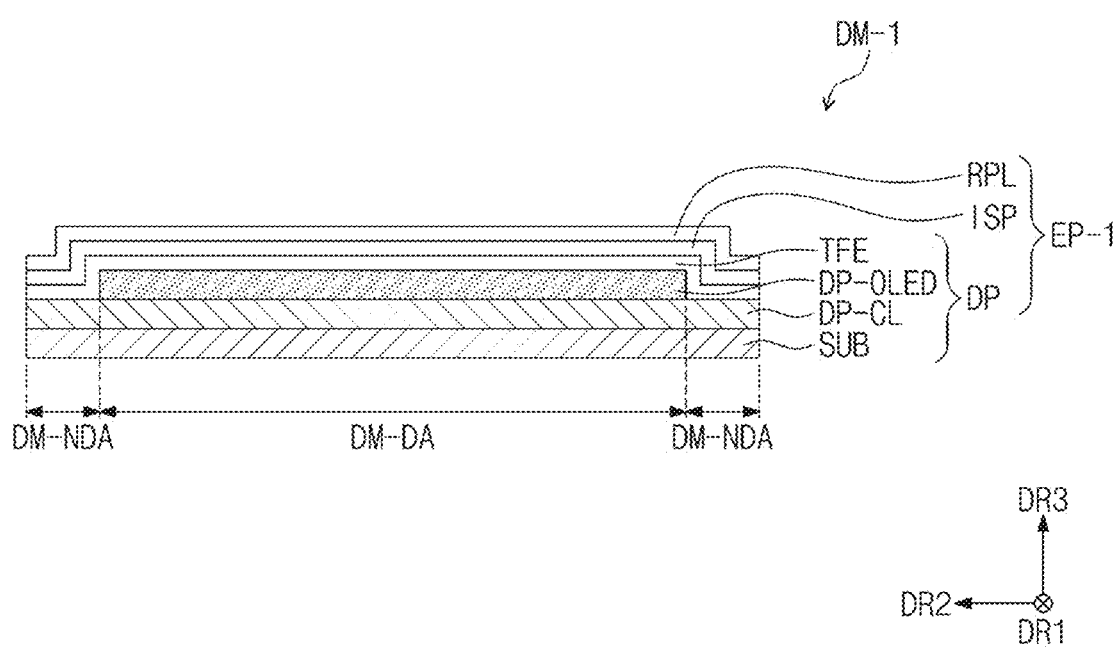
FIG. 5 is a cross-sectional view of a display module according to an embodiment.

FIG. 5 is a cross-sectional view of a display module DM-1 according to an embodiment. A display module DM-1 of FIG. 5 includes an electronic panel EP-1 according to an embodiment of the invention, which has a structure different from that of the electronic panel EP shown in FIG. 4.

Referring to FIG. 5, the display module DM-1 according to an embodiment may include an anti-reflection layer RPL. The anti-reflection layer RPL may be directly formed on the input sensor ISP when the display module DM-1 is manufactured.

The anti-reflection layer RPL may reduce reflectance of external light incident to the display device DD (see FIG. 1). The anti-reflection layer RPL may include an optical film for reducing the reflectance of external light. For example, the anti-reflection layer RPL may include a retarder and/or a polarizer. The anti-reflection layer RPL may include a polarizing film. However, the embodiment of the anti-reflection layer RPL is not limited thereto, and the anti-reflection layer RPL may include a plurality of color filters and a light blocking pattern, or may include a reflection adjustment layer.

FIG. 6 is a plan view of a display panel DP according to an embodiment.

Referring to FIG. 6, the display panel DP may include a display region DP-DA and a non-display region DP-NDA which is adjacent to the display region DP-DA≤ such as being around the display region DA. The display region DP-DA and the non-display region DP-NDA are defined with respect to presence/absence of the pixels PX. The display region DP-DA and the non-display region DP-NDA correspond to the display region DA and the non-display region NDA of the display device DD (see FIG. 1), respectively. A scan driver SDV, a data driver DDV, and an emission driver EDV may be disposed in the non-display region DP-NDA.

The display panel DP includes a first region AA1, a second region AA2, and a bending region BA at which the display panel DP is bendable, which are separated from each other in the second direction DR2. When the display device DD is unfolded as shown in FIG. 1, the first region AA1 and the second region AA2 of the display panel DP mounted on the display device DD are disposed in different planes from each other along the thickness direction. This will be described later in FIG. 8. The bending region BA is disposed between the first region AA1 and the second region AA2. The bending shape of the bending region BA will be described later with reference to FIG. 8. FIG. 6 shows an unfolded state of the display panel DP before being mounted in the display device DD.

The first region AA1 is a portion corresponding to the display surface DS (see FIG. 1). The first region AA1 may include a first non-folding region NFA10, a second non-folding region NFA20, and a folding region FA10. The first non-folding region NFA10, the second non-folding region NFA20, and the folding region FA10 correspond to the first non-folding region NFA1, the second non-folding region NFA2, and the folding region FA of FIGS. 1 to 3, respectively.

The display panel DP may have a width along the first direction DR1, at various locations along a length of the display panel DP in the second direction DR2. The width of the bending region BA and the second region AA2 may be smaller than a width of the first region AA1, in the second direction DR2. The second region AA2 and the bending region BA may be a portion of the non-display region DP-NDA.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a power line PL, and a pad PD provided in plural including a plurality of pads PD. In this case, 'm' and 'n' are natural numbers. The pixels PX may be connected to the scan lines SL1 to SLm, the data lines DL1 to DLn, and the emission lines EL1 to ELm. That is, the display region DP-DA may be connected to the non-display region DP-NDA.

The data driver DDV may be disposed in the second region AA2. The data driver DDV may be an integrated circuit chip. The scan lines SL1 to SLm may extend in the second direction DR2 and be connected to the scan driver SDV. The data lines DL1 to DLn extend in the first direction DR1, and may be connected to the data driver DDV via the bending region BA. The emission lines EL1 to ELm may extend in the second direction DR2 and be connected to the emission driver EDV. An element may extend in the direction corresponding to a major dimension or a maximum dimension, like a length, for defining an extension direction of such element.

The power line PL may extend along the second direction DR2, and may extend from the first region AA1 to the second region AA2 via the being region BA. The power line PL may provide a driving voltage to the pixels PX. The power line PL may be disposed in the non-display region DP-NDA. The power line PL may extend along the second direction DR2 and be disposed in the non-display region DP-NDA. Although the power line PL is shown to be disposed between the display region DP-DA and the emission driver EDV, the embodiment of the invention is not limited thereto, and the power line PL may be disposed between the display region DP-DA and the scan driver SDV.

The connection lines CNL may extend along the first direction DR1 and may be arranged in the second direction DR2, such as to be spaced apart from each other along the second direction DR2. The connection lines CNL may be connected to the power line PL and the pixels PX. The driving voltage may be applied to the pixels PX through the power line PL and the connection lines CNL connected to each other.

The first control line CSL1 is connected to the scan driver SDV, and may extend toward a lower end of the second region AA2 via the bending region BA. The second control line CSL2 is connected to the emission driver EDV, and may extend toward a lower end of the second region AA2 via the bending region BA.

When viewed on a plane, the pads PD may be disposed adjacent to the lower end of the second region AA2. The data driver DDV, the power line PL, the first control line CSL1, and the second control line CSL2 may be connected to the pads PD. The data lines DL1 to DLn may be connected to corresponding pads PD through the data driver DDV. For example, the data lines DL1 to DLn may be connected to the data driver DDV, and the data driver DDV may be connected to the pads PD respectively corresponding to the data lines DL1 to DLn.

Although not shown, a printed circuit board PCB may be connected to the display panel DP, at the pads PD, and a timing controller and a voltage generator may be disposed on the printed circuit board PCB. The timing controller may be manufactured as an integrated circuit chip and mounted on the printed circuit board PCB. The timing controller and the voltage generator may be connected to the pads PD through the printed circuit board PCB. The timing controller may control the operation of the scan driver SDV, the data driver DDV, and the emission driver EDV. The timing controller may generate a scan control signal, a data control signal, and an emission control signal in response to control signals received from the outside. The scan control signal may be provided to the scan driver SDV through the first control line CSL1. The emission control signal may be provided to the emission driver EDV through the second control line CSL2. The data control signal may be provided to the data driver DDV.

The scan driver SDV may generate a plurality of scan signals in response to the scan control signal. The scan signals may be applied to the pixels PX through the scan lines SL1 to SLm. The scan signals may be sequentially applied to the pixels PX.

The data driver DDV may generate a plurality of data voltages corresponding the image signals in response to the data control signal. The data voltages may be applied to the pixels PX through the data lines DL1 to DLn.

The emission driver EDV may generate a plurality of emission signals in response to the emission control signal. The emission signals may be applied to the pixels PX through the emission lines EL1 to ELm.

The pixels PX may be provided with the data voltages in response to the scan signals. The pixels PX may display an image IM by emitting light of luminance corresponding to the data voltages in response to the emission signals. The emission duration of the pixels PX may be controlled by the emission signals.

Figure 7:
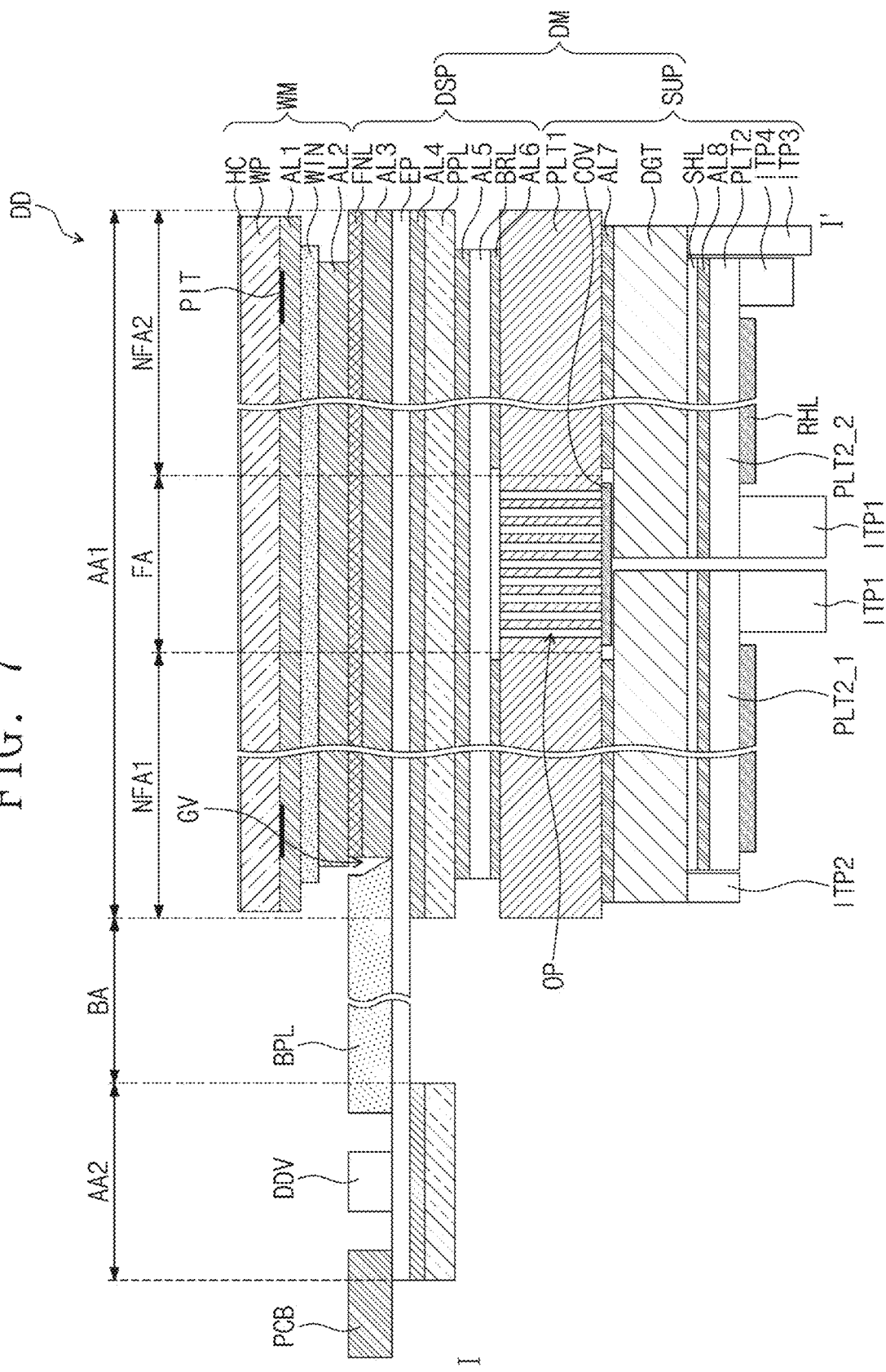
FIG. 7 is a cross-sectional view of a display device according to an embodiment.
Figure 8:
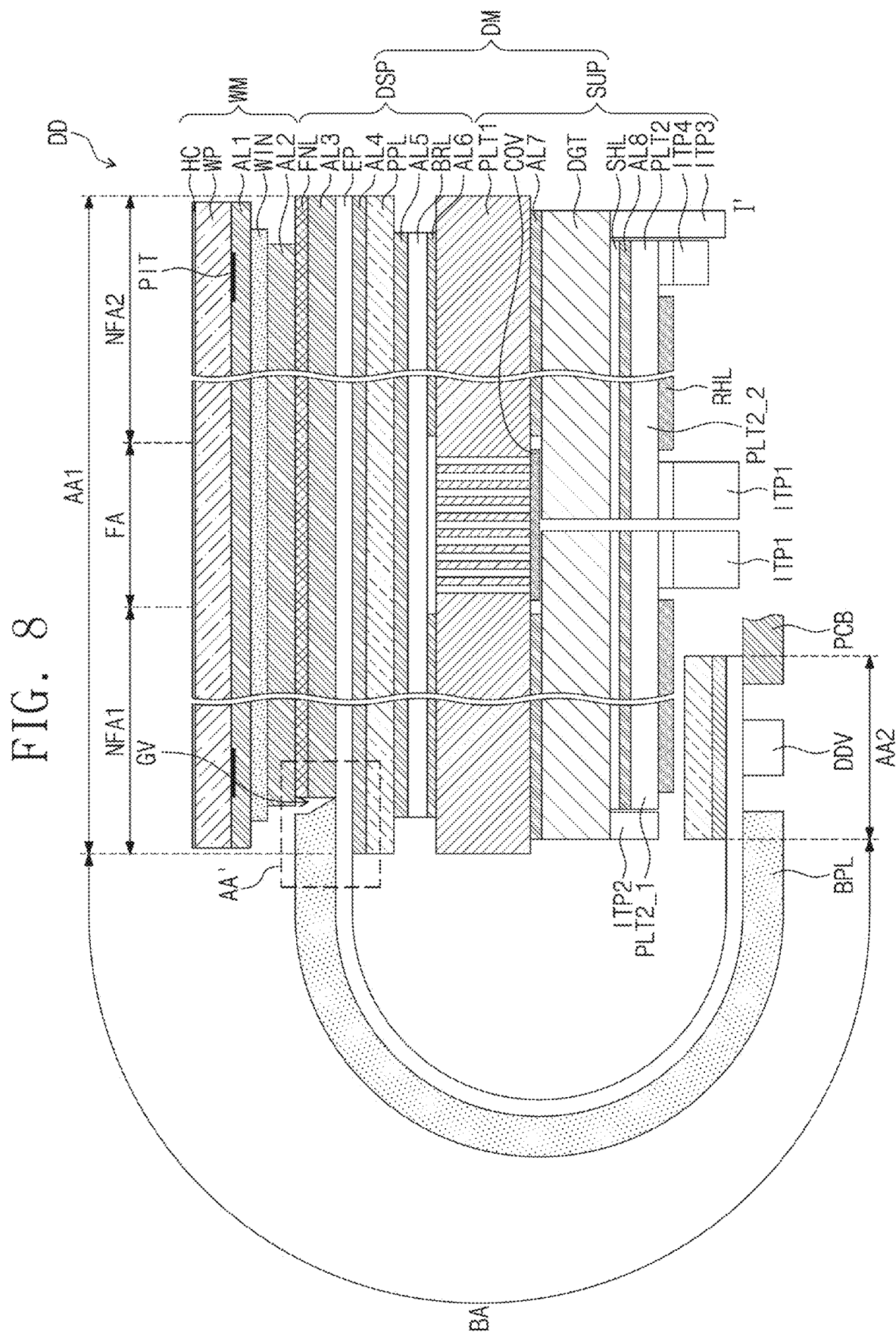
FIG. 8 is a cross-sectional view showing a state in which a portion of the display device of FIG. 7 is bent.

FIG. 7 is a cross-sectional view of a display device DD according to an embodiment. FIG. 8 is a cross-sectional view showing a state in which a portion of the display device DD of FIG. 7 is bent.

FIG. 7 is a cross-sectional view taken along line I-I' shown in FIG. 6. In FIG. 7, a cross-section of the display module DM and a cross-section of the window module WM corresponding to the line I-I' are shown together.

Referring to FIG. 7, the display device DD may include a display module DM and a window module WM which is disposed on the display module DM. The window module WM may be disposed on the display module DM to protect the display module DM.

The display module DM may include a display portion DSP and a support portion SUP. The support portion SUP may be disposed below the display portion DSP to support the display portion DSP. The support portion SUP may face the window module WM, with the display portion DSP therebetween.

The window module WM may include a window WIN, a window protection layer WP, a hard coating layer HC, and first and second adhesive layers AL1 and AL2. The display portion DSP may include an electronic panel EP, a functional layer FNL, a panel protection layer PPL, a barrier layer BRL, and third to sixth adhesive layers AL3, AL4, AL5, and AL6.

The electronic panel EP may be the electronic panel EP shown in FIG. 4. As in the display panel DP, the electronic panel EP may include a first region AA1, a second region AA2, and a bending region BA between the first region AA1 and the second region AA2. The functional layer FNL may be disposed on the electronic panel EP.

The functional layer FNL, as described above, may be an anti-reflection layer or a shock absorbing layer. When the functional layer FNL is an anti-reflection layer, the functional layer FNL may reduce reflectance of external light incident to the display device DD. The functional layer FNL may include an optical film for reducing the reflectance of external light. For example, the functional layer FNL may include a retarder and/or a polarizer. For example, the functional layer FNL may include a polarizing film.

When the functional layer FNL is a shock absorbing layer, the functional layer FNL may absorb external shocks applied from the top of the display device DD toward the electronic panel EP to protect the electronic panel EP. The functional layer FNL may be prepared in the form of a stretched film.

The functional layer FNL may include a flexible plastic material. The flexible plastic material may be defined as a synthetic resin film. For example, the functional layer FNL may include a flexible plastic material such as polyimide (PI) or polyethyleneterephthalate (PET).

The window WIN may be disposed on the functional layer FNL. The window WIN may protect the electronic panel EP from external scratches. The window WIN may have optically transparent properties. The window WIN may include glass. However, the embodiment of the invention is not limited thereto, and the window WIN may include a synthetic resin film.

The window WIN may have a multi-layer structure or a single-layer structure. For example, the window WIN may include a plurality of synthetic resin films bonded through an adhesive, or a glass substrate and a synthetic resin film bonded through an adhesive.

The window protection layer WP may be disposed on the window WIN. The window protection layer WP may include a flexible plastic material such as polyimide or polyethylene terephthalate. The hard coating layer HC may be disposed on an upper surface of the window protection layer WP.

A print layer PIT which blocks light may be disposed on a lower surface of the window protection layer WP. The print layer PIT may be black, but the color of the print layer PIT is not limited thereto. The print layer PIT may be disposed adjacent to an edge of the window protection layer WP.

The panel protection layer PPL may be disposed below the electronic panel EP including the display panel DP (see FIG. 4). The panel protection layer PPL may protect a lower portion of the electronic panel EP. The panel protection layer PPL may include a flexible plastic material. For example, the panel protection layer PPL may include polyethylene terephthalate (PET). The panel protection layer PPL may be disconnected at the bending region BA.

The barrier layer BRL may be disposed below the panel protection layer PPL. The barrier layer BRL may increase resistance against compressive force caused by external pressing. The barrier layer BRL may serve to prevent deformation of the electronic panel EP. The barrier layer BRL may include a flexible plastic material such as polyimide or polyethylene terephthalate.

The barrier layer BRL may have a color which absorbs light. For example, the barrier layer BRL may be black in color. In this case, when the display module DM is viewed from above the display module DM, elements disposed below the barrier layer BRL may not be viewable.

The first adhesive layer AL1 may be disposed between the window protection layer WP and the window WIN. By the first adhesive layer AL1, the window protection layer WP and the window WIN may be bonded to each other. In an embodiment, the print layer PIT may be disposed between the window protection layer WP and the first adhesive layer AL1.

The second adhesive layer AL2 may be disposed between the window WIN and the functional layer FNL. By the second adhesive layer AL2, the window WIN and the functional layer FNL may be bonded to each other.

The third adhesive layer AL3 may be disposed between the functional layer FNL and the electronic panel EP. By the third adhesive layer AL3, the functional layer FNL and the electronic panel EP may be bonded to each other.

The fourth adhesive layer AL4 may be disposed between the electronic panel EP and the panel protection layer PPL. The fourth adhesive layer AL4 may be disconnected at the bending region BA. By the fourth adhesive layer AL4, the electronic panel EP and the panel protection layer PPL may be bonded to each other.

The fifth adhesive layer AL5 may be disposed between the panel protection layer PPL and the barrier layer BRL. By the fifth adhesive layer AL5, the panel protection layer PPL and the barrier layer BRL may be bonded to each other.

The sixth adhesive layer AL6 may be disposed between the barrier layer BRL and the first support plate PLT1. By the sixth adhesive layer AL6, the barrier layer BRL and the first support plate PLT1 may be bonded to each other.

The sixth adhesive layer AL6 may overlap the first and second non-folding regions NFA1 and NFA2 and may not overlap the folding region FA. That is, the sixth adhesive layer AL6 may be open or disconnected at the folding region FA.

The first to sixth adhesive layers AL1 to AL6 may include a transparent adhesive, such as a pressure sensitive adhesive (PSA) or an optically clear adhesive (OCA), but the type of the adhesive is not limited thereto.

Widths of the window WIN and the second adhesive layer AL2 may be smaller than width of the window protection layer WP and the first adhesive layer AL1. The width of the second adhesive layer AL2 may be smaller than the width of the window WIN. An edge (e.g., an outer edge) of the window WIN may be disposed on a further inner side than outer edges of the window protection layer WP and the first adhesive layer AL1, that is, closer to the folding region FA than the outer edges of the window protection layer WP and the first adhesive layer AL1. An outer edge of the second adhesive layer AL2, which is furthest from the display region DM-DA, may be disposed on an inner side of the outer edge of the window WIN (e.g., closer to the display region DM-DA than the outer edge of the window WIN).

Widths of the barrier layer BRL and the fifth and sixth adhesive layers AL5 and AL6, may be smaller than the widths of the window protection layer WP and the first adhesive layer AL1. Edges (e.g., outer edges) of the barrier layer BRL and the fifth and sixth adhesive layers AL5 and AL6, may be disposed closer to the folding region FA than the outer edges of the window protection layer WP and the first adhesive layer AL1, where an outer edge is defined furthest from the display region DM-DA. However, the width of each element is not limited thereto.

The support portion SUP may include a first support plate PLT1, a second support plate PLT2, a cover layer COV, a digitizer DGT, a shielding layer SHL, a heat dissipation layer RHL, seventh and eighth adhesive layers AL7 and AL8, and a plurality of first to fourth insulating tapes ITP1 to ITP4.

The first support plate PLT1 may be disposed below the electronic panel EP to support the electronic panel EP. The first support plate PLT1 may be disposed below the barrier layer BRL.

Rigidity of the first support plate PLT1 may be greater than that of the display portion DSP. The first support plate PLT1 may include a non-metal material. For example, the first support plate PLT1 may include a reinforcing fiber composite material. The reinforcing fiber composite material may be carbon fiber reinforced plastic (CFRP) or glass fiber reinforced plastic (GFRP).

The first support plate PLT1 may include a reinforcing fiber composite material to be lightweight. The first support plate PLT1 according to an embodiment may include a reinforcing fiber composite material, and thus be lightweight compared to a metal support plate using a metal material, and may have a modulus and strength similar to that of the metal support plate.

The first support plate PLT1 includes a reinforcing fiber composite material, and shape processing of the first support plate PLT1 may thus be easier compared to the metal support plate. For example, the first support plate PLT1 including a reinforcing fiber composite material may be more easily processed through a laser process or a micro-blast process.

In a portion of the first support plate PLT1 overlapping the folding region FA, a plurality of openings OP may be defined. The openings OP may be formed to pass through portions of the first support plate PLT1 in the third direction DR3. The openings OP may be formed through the laser process or the micro-blast process, which is described above.

Since the openings OP are defined in the portion of the first support plate PLT1 overlapping the folding region FA, the flexibility of the portion of the first support plate PLT1 overlapping the folding region FA may increase. As a result, the first support plate PLT1 may be easily foldable at the folding region FA. A more detailed shape of the openings OP will be described in detail below.

The cover layer COV may be disposed below the first support plate PLT1. Below the first support plate PLT1, the cover layer COV may cover the openings OP defined on the first support plate PLT1. The cover layer COV may overlap the folding region FA and may not overlap the first and second non-folding regions NFA1 and NFA2. That is, the cover layer COV may not be disposed in the first and second non-folding regions NFA1 and NFA2. As not overlapping, elements may be spaced apart from each other or adjacent to each other, along a plane direction. The cover layer COV may contact a lower surface of the portion of the first support plate PLT1 in which the openings OP are formed. As being in contact, elements may form an interface therebetween.

The cover layer COV may have an elastic modulus lower than that of the first support plate PLT1. For example, the cover layer COV may include thermoplastic polyurethane or rubber, but the material of the cover layer COV is not limited thereto. The cover layer COV may be manufactured in the form of a sheet and be bonded to the first support plate PLT1.

The digitizer DGT may be disposed below the first support plate PLT1. The cover layer COV may be disposed between the first support plate PLT1 and the digitizer DGT. The cover layer COV may be spaced apart from an upper surface of the digitizer DGT.

The digitizer DGT is a device that may receive location information instructed by users on a display surface. The digitizer DGT may be applied using an electromagnetic method (or an electromagnetic resonance method). For example, the digitizer DGT may include a digitizer sensor substrate (not shown) including a plurality of coils. However, the embodiment of the invention is not limited thereto, and the digitizer DGT may be applied as an active electrostatic type.

When an input tool such as a pen is moved relative to or on the display device DD, the pen is driven by an alternating current (AC) signal to generate a vibrating magnetic field, and the vibrating magnetic field may induce signals in the coil. A position of the pen may be detected through the signals induced in the coil. The digitizer DGT may detect the position of the pen by sensing electromagnetic changes generated by an approach of the pen.

When the first support plate PLT1 disposed on the digitizer DGT and adjacent to the digitizer DGT includes metal, the metal may reduce sensitivity of the digitizer DGT. For example, when signals transmitted on the display device DD are blocked due to signal interference by a metal support plate, the digitizer DGT may not work properly. However, in an embodiment of the invention, the first support plate PLT1 disposed on the digitizer DGT includes a non-metal reinforcing fiber composite material, and the digitizer DGT may thus work properly.

The digitizer DGT may be divided or disconnected into two portions, at the folding region FA. The divided portions of the digitizer DGT may be connected to a digitizer driver (not shown) through flexible circuit boards.

The shielding layer SHL may be disposed below the digitizer DGT. The shielding layer SHL may include a metal. For example, the shielding layer SHL may include copper, but the metal material of the shielding layer SHL is not limited thereto. The shielding layer SHL may be divided or disconnected into two portions, at the folding region FA. The divided portions of the shielding layer SHL may be respectively disposed below the divided portions of the digitizer DGT.

The shielding layer SHL may shield electromagnetics that may be applied to the digitizer DGT from below the display device DD. The shielding layer SHL may be defined as an electromagnetic shielding layer. The shielding layer SHL including a metal may serve as a heat dissipation layer.

The second support plate PLT2 may be disposed below the shielding layer SHL. The second support plate PLT2 may be more rigid than the display portion DSP. The second support plate PLT2 may include a metal material such as stainless steel (e.g., SUS 316), but the metal material of the second support plate PLT2 is not limited thereto. In addition, the second support plate PLT2 is not limited thereto, and may include a non-metal material such as plastic.

The second support plate PLT2 may be divided or disconnected into two portions, at the folding region FA. For example, the second support plate PLT2 may include a 2_1 support plate PLT2_1 overlapping the first non-folding region NFA1 and a 2_2 support plate PLT2_2 overlapping the second non-folding region NFA2.

The 2_1 support plate PLT2_1 may support the first non-folding region NFA1. The 2_2 support plate PLT2_2 may support the second non-folding region NFA2. The 2_1 support plate PLT2_1 and the 2_2 support plate PLT2_2 may extend to the folding region FA and disposed adjacent to each other in the folding region FA. The 2_1 support plate PLT2_1 and the 2_2 support plate PLT2_2 may be spaced apart from each other below the folding region FA.

The 2_1 support plate PLT2_1 and the 2_2 support plate PLT2_2 may support, below the folding region FA, the portion of the first support plate PLT1 in which the openings OP are disposed. When pressure is applied to the first support plate PLT1 from an upper portion, deformation of the portion of the first support plate PLT1 in which the openings OP are defined may be prevented by the 2_1 support plate PLT2_1 and the 2_2 support plate PLT2_2. Additionally, the 2_1 and 2_2 support plates PLT2_1 and PLT2_2 may perform a heat dissipation function.

The heat dissipation layer RHL may be disposed below the second support plate PLT2. The heat dissipation layer RHL may be divided into two in the folding region FA. The divided portions of the heat dissipation layer RHL may be respectively disposed below the 2_1 and 2_2 support plates PLT2_1 and PLT2_2.

The heat dissipation layer RHL may perform a heat dissipation function. For example, the heat dissipation layer RHL may include graphite, but the material of the heat dissipation layer RHL is not limited thereto. The heat dissipation layer RHL, along with the second support plate PLT2 and the shielding layer SHL, performs a heat dissipation function, and the heat dissipation performance of the display device DD may thus improve.

The first to fourth insulating tapes ITP1 to ITP4 may be disposed below the digitizer DGT and the second support plate PLT2. The first to fourth insulating tapes ITP1 to ITP4 may include an insulating material.

Two first insulating tapes ITP1 may be adjacent to one side of the 2_1 support plate PLT2_1 and one side of the 2_2 support plate PLT2_2 facing each other, and may each be disposed below the second support plates PLT2_1 and PLT2_2.

The second insulating tape ITP2 and the third insulating tape ITP3 may be respectively adjacent to opposing sides of the digitizer DGT and disposed below the digitizer DGT. The second insulating tape ITP2 may be adjacent to an outer edge of the 2_1 support plate PLT2_1, and the third insulating tape ITP3 may be adjacent to an outer edge of the 2_2 support plate PLT2_2.

The fourth insulating tape ITP4 may be adjacent to the other side of the 2_2 support plate PLT2_2, which is opposite to one side of the 2_2 support plate PLT2_2. The fourth insulating tape ITP4 may be disposed below the 2_2 support plate PLT2_2.

The shielding layer SHL, the second support plate PLT2, the heat dissipation layer RHL, the first insulating tapes ITP1, and the fourth insulating tape ITP4 may be disposed between the second insulating tape ITP2 and the third insulating tape ITP3. One of the divided heat dissipation layers RHL may be disposed between the first insulating tape ITP1 and the fourth insulating tape ITP4, which are disposed below the 2_2 support plate PLT2_2. The other of the divided heat dissipation layers RHL may be disposed between the first insulating tape ITP1 disposed below the 2_1 support plate PLT2_1 and the second insulating tape ITP2 disposed below the digitizer DGT.

Although not shown, magnets may be disposed below the display module DM to maintain a folded state of the display module DM and/or the display device DD, in the display device DD which is folded. The magnets may be adjacent to an edge of the display device DD. The folded state of the display device DD may be maintained through magnetic forces of the magnets.

When the magnetic forces of the magnets are delivered to the digitizer DGT, the digitizer DGT may not work properly. The first to fourth insulating tapes ITP1 to ITP4 may block the magnetic forces of the magnets disposed on the edge of the display device DD from being delivered to the digitizer DGT. The first to fourth insulating tapes ITP1 to ITP4 may be defined as magnetic shielding tapes.

The seventh adhesive layer AL7 may be disposed between the first support plate PLT1 and the digitizer DGT. By the seventh adhesive layer AL7, the first support plate PLT1 and the digitizer DGT may be bonded to each other. The seventh adhesive layer AL7 may not be disposed in the folding region FA. That is, the seventh adhesive layer AL7 may be open in the folding region FA.

The cover layer COV described above may be disposed in the opening of the seventh adhesive layer AL7. The cover layer COV and the portions of the seventh adhesive layer AL7 may be coplanar with each other, Since the seventh adhesive layer AL7 is not disposed below the folding region FA, the folding operation of the support portion SUP may be performed more easily.

The eighth adhesive layer AL8 may be disposed between the shielding layer SHL and the second support plate PLT2. By the eighth adhesive layer AL8, the shielding layer SHL and the second support plate PLT2 may be bonded to each other. The eighth adhesive layer AL8 may be divided in the folding region FA. The divided portions of the eighth adhesive layer AL8 may each be disposed between the divided portions of the shielding layer SHL and the 2_1 and 2_2 support plates PLT2_1 and PLT2_2. The eighth adhesive layer AL8 may be disposed between the second insulating tape ITP2 and the third insulating tape ITP3.

The width of the first support plate PLT1 may be substantially equal to the width of the electronic panel EP. Widths of the digitizer DGT and the seventh adhesive layer AL7 may be smaller than the width of the first support plate PLT1. Edges of the digitizer DGT and the seventh adhesive layer AL7 may be disposed on a further inner side than the edge of the first support plate PLT1.

Widths of the shielding layer SHL, the eighth adhesive layer AL8, and the second support plate PLT2 may be smaller than the widths of the digitizer DGT. The edges of the shielding layer SHL, the eighth adhesive layer AL8, and the second support plate PLT2 may be disposed on a further inner side than the edge of the digitizer DGT.

The seventh and eighth adhesive layers AL7 and AL8 may include a pressure sensitive adhesive (PSA) or an optically clear adhesive (OCA), but the type of the adhesive is not limited thereto.

The display device DD may include a bending protection layer BPL. The bending protection layer BPL is disposed to overlap at least the bending region BA when viewed on a plane. The bending protection layer BPL may overlap the bending region BA, the first region AA1, and the second region AA2. The bending protection layer BPL may be disposed on a portion of the first region AA1 and a portion of the second region AA2. The printed circuit board PCB may be connected to one side of the second region AA2.

The data driver DDV and the printed circuit board PCB may be disposed on one end of the second region AA2, that is, a distal end of the electronic panel EP. The bending protection layer BPL may be spaced apart from the data driver DDV, in a direction along the electronic panel EP as an electronic display panel.

Referring to FIG. 8, the display device DD may be bent at the bending region BA such that the second region AA2 is disposed below the first region AA1 along a thickness direction of the display device DD which is bent. That is, the first region AA1 and the second region AA2 are disposed in different planes (or reference planes) along the thickness direction. The bending region BA is bent to be horizontally convex on a cross-section. The bending region BA has a predetermined curvature and has a curvature radius, at the folding region FA. The radius of curvature may be about 0.1 millimeter (mm) to about 0.5 mm. Within the display device DD which is bent, the bending region BA may define an end portion of the display device DD.

Accordingly, the panel protection layer PPL and the fourth adhesive layer AL4 may be disposed below the electronic panel EP in the second region AA2. The data driver DDV and the printed circuit board PCB may be disposed on the electronic panel EP in the second region AA2.

The bending protection layer BPL may be bent along with the bending region BA. The bending protection layer BPL may protect the bending region BA from external shocks. The bending protection layer BPL may cover and protect the signal lines CSL1, DL1 to DLn, PL, and CSL2 (see FIG. 6) disposed in the bending region BA. In addition, when the bending region BA is bent, cracks in the bending region BA may be prevented by supplementing rigidity of the bending region BA of the bending protection layer BPL.

The bending protection layer BPL may include an epoxy-based resin, an acrylic resin, a urethane-based resin, or a urethane acrylate-based resin. For example, the bending protection layer BPL may include an acrylic resin or a urethane-based resin.

One side of the bending protection layer BPL disposed in the first region AA1, may face a side surface of the functional layer FNL adjacent to (or closest to) the bending region BA, and a side surface of the third adhesive layer AL3 adjacent to (or closest to) the bending region BA. Specifically, the side surface of the functional layer FNL may be spaced apart from the side surface side of the bending protection layer BPL, and the side surface of the third adhesive layer AL3 may contact the side surface of the bending protection layer BPL. Accordingly, a groove GV may be defined between the one side surface of the bending protection layer BPL disposed in the first region AA1, the side surface of the functional layer FNL. The groove GV may extend to have an increasing width in a direction away from the electronic panel EP, at a location between the side surface of the bending protection layer BPL and the side surface of the third adhesive layer AL3.

Figure 9:
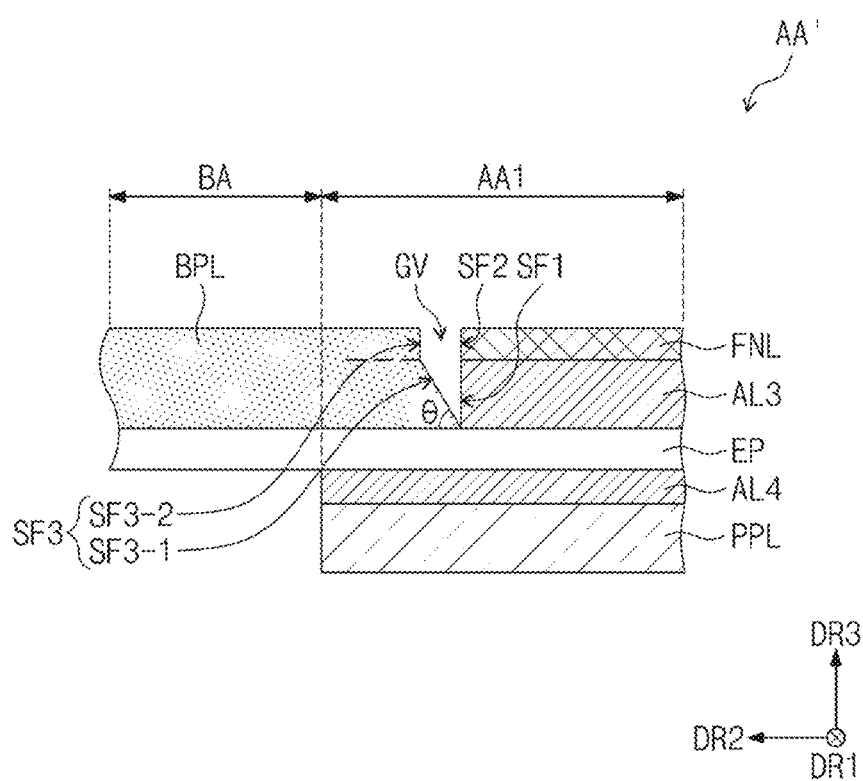
FIG. 9 is an enlarged cross-sectional view of a portion of FIG. 8.

FIG. 9 is a cross-sectional view enlarging a portion of FIG. 8 (e.g., an enlarged cross-sectional view). FIG. 9 is a cross-sectional view of an embodiment, enlarging a region AA' of FIG. 8. FIG. 9 is a cross-sectional view enlarging a portion of the display device DD which is closest to and extends directly from the first region AA1, and in which the folding region FA (see FIG. 8) is not folded. Hereinafter, an electronic panel EP including the display panel DP (see FIG. 4) will be described as a reference in the drawings. For convenience of description, the region AN is shown without the second adhesive layer AL2.

FIG. 9 is a cross-sectional view enlarging a portion of the bending region BA and the first region AA1, which are each flat.

Referring to FIG. 9, the third adhesive layer AL3 and the functional layer FNL are disposed on the electronic panel EP and overlap the first region AA1 when viewed on a plane. Specifically, the third adhesive layer AL3 is disposed on the electronic panel EP, and the functional layer FNL is disposed on the third adhesive layer AL3. The third adhesive layer AL3 may be directly disposed on the electronic panel EP, and the functional layer FNL may be directly disposed on the third adhesive layer AL3.

The bending protection layer BPL is disposed on the electronic panel EP, and may overlap the bending region BA, a portion of the first region AA1, and a portion of the second region AA2 (see FIGS. 7 and 8) when viewed on a plane. The bending protection layer BPL may be directly disposed on the electronic panel EP.

The bending protection layer BPL may face the third adhesive layer AL3 and the functional layer FNL, in a direction along the electronic panel EP.

The third adhesive layer AL3 includes a first side surface SF1 that is a side surface adjacent to (or closest to) the bending protection layer BPL, and the functional layer FNL includes a second side surface SF2 that is a side surface adjacent to the bending protection layer BPL. In a portion of the folding region FA (see FIG. 8) which is not folded, the first side surface SF1 may be aligned with the second side surface SF2. The bending protection layer BPL may include a third side surface SF3 (e.g., a bending protection layer side surface) facing the functional layer FNL and the third adhesive layer AL3. Specifically, the third side surface SF3 may include a 3-1 side surface SF3-1 facing the first side surface SF1 and a 3-2 side surface SF3-2 facing the second side surface SF2.

In the portion of the folding region FA (see FIG. 8) which is not folded, the 3-2 th side surface SF3-2 may be spaced apart from the second side surface SF2, and at least a portion of the 3-1 side surface SF3-1 may contact the first side surface SF1. The contact may extend along the first direction DR1, such as along a lower edge of the third adhesive layer AL3.

In an embodiment, the 3-1 side surface SF3-1 may include an inclined surface forming an inclination angle θ with respect to the electronic panel EP. The inclination angle may be greater than 0 degrees (°) and less than about 90°.

The inclination angle θ may be affected by thickness of the third adhesive layer AL3 and materials included in the functional layer FNL.

FIG. 9 shows that an entirety of the 3-1 side surface SF3-1 is an inclined surface, but the embodiment of the invention is not limited thereto, and a portion of the 3-1 side surface SF3-1 which is closest to the first side surface SF1 may be vertical, while the remaining portion of the 3-1 side surface SF3-1 may be an inclined surface. In this case, a contact area between the 3-1 side surface SF3-1 and the first side surface SF1 may be greater than the surface shown in FIG. 9, owing to the 3-1 side surface SF3-1 being partially vertical and contacting the vertical side surface of the third adhesive layer AL3.

In the display device DD (see FIG. 8) of the invention, in a flat state before the folding region FA is folded, even when the bending protection layer BPL is spaced apart from the functional layer FNL, at least a portion of the bending protection layer BPL contacts the third adhesive layer AL3. Accordingly, the electronic panel EP disposed in the first region AA1 and the bending region BA may be covered by the bending protection layer BPL or the third adhesive layer AL3, and the electronic panel EP may be protected from external static electricity. As being covered, the electronic panel EP may not be exposed to outside the third adhesive layer AL3 and the bending protection layer BPL, owing to the contact therebetween.

Figure 10:
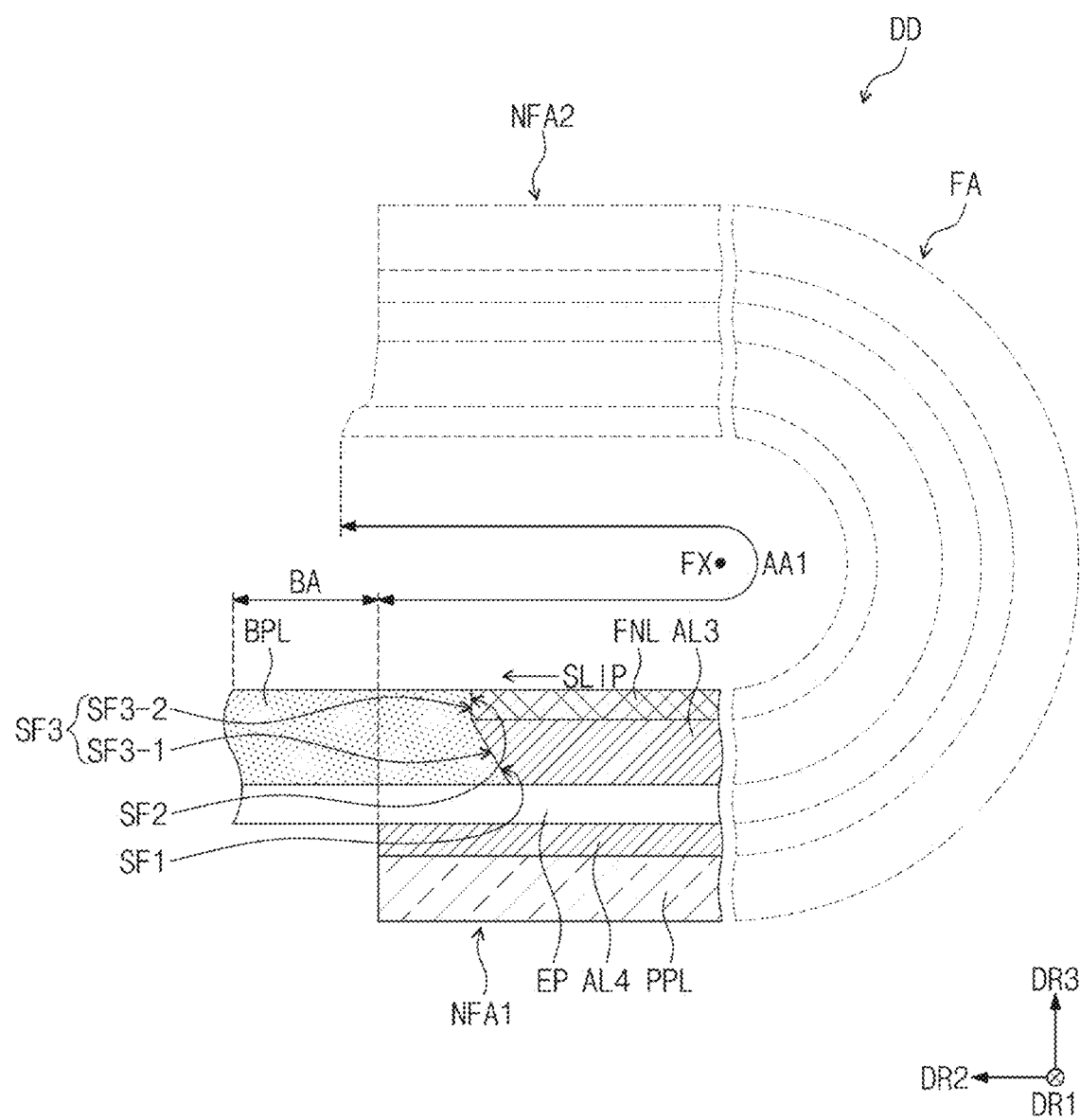
FIG. 10 is a cross-sectional view showing a change occurring upon folding of a display device according to an embodiment.

FIG. 10 is a cross-sectional view showing a change occurring upon folding of a display device DD according to an embodiment.

Referring to FIG. 10, when the display device DD is folded with respect to the folding axis FX, the functional layer FNL and the third adhesive layer AL3 may be folded together with each other. A portion indicated shown in dotted line in FIG. 10 is configured the same as the folding region FA and the second non-folding region NFA2 described above in FIGS. 7 and 8.

As the display device DD is inner-folded, the functional layer FNL and the third adhesive layer AL3 disposed above the electronic panel EP may slip from an original position, in a direction of the bending region BA. For example, the functional layer FNL may slip in the direction of the bending region BA, from the first region AA1 by the third adhesive layer AL3 having fluidity, to be disposed in a slipped position. That is, each of the functional layer FNL and the third adhesive layer AL3 are slidable along the display panel DP, in a direction of the bending region BA. The folding of the display panel DP at the bending region BA may slide the functional layer FNL and the third adhesive layer AL3 together with each other, along the display panel DP, in a direction from the first region AA1 toward the bending region BA.

The functional layer FNL may have a harder property than the third adhesive layer AL3. Referring to FIGS. 9 and 10 together, as the display device DD is folded at the folding region FA, the first side surface SF1 of the third adhesive layer AL3 may become inclined from an original vertical position, and the second side surface SF2 of the functional layer FNL may remain vertical but move in the direction of the bending region BA along the adhesive layer AL3. That is, the slipped position may include the first side surface SF1 of the third adhesive layer AL3 inclined and the second side surface SF2 of the functional layer FNL vertical.

Accordingly, slipped positions of the functional layer FNL and the third adhesive layer AL3 may contact the side surfaces of the bending protection layer BPL. Since the first side surface SF1 is aligned with the 3-1 side surface SF3-1, and the second side surface SF2 is aligned with the 3-2 side surface SF3-2, the functional layer FNL and the third adhesive layer AL3 do not push the bending protection layer BPL, and an extra stress is not applied to the bending protection layer BPL. Even when the display device DD is folded at the folding area FA, the bending protection layer BPL may not be damaged, and lines (e.g., signal lines, power lines, etc.) disposed in the bending region BA may not be damaged.

Figure 11A:
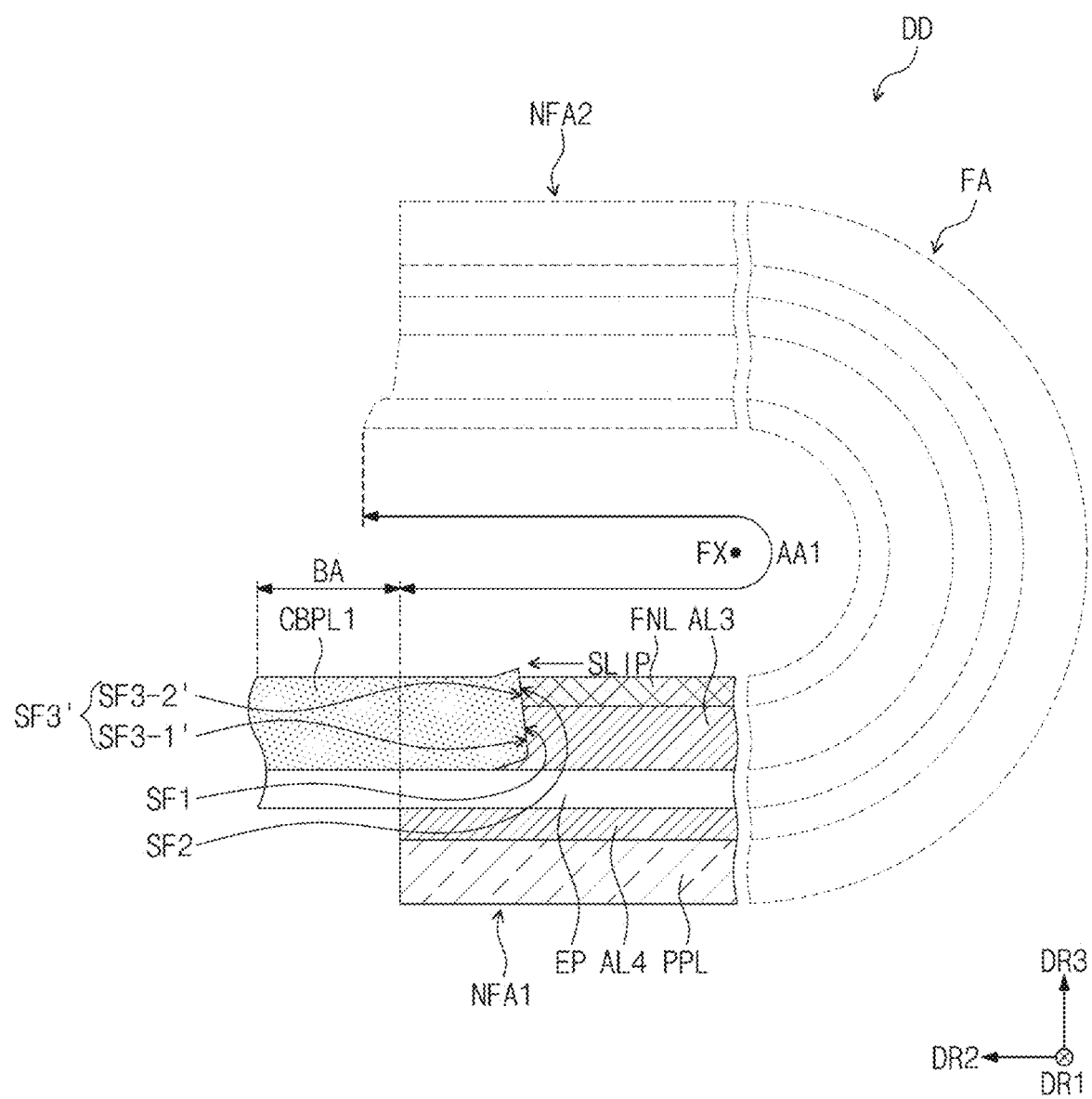
FIG. 11A is a cross-sectional view showing a change occurring upon folding of a display device according to Comparative Example.
Figure 11B:
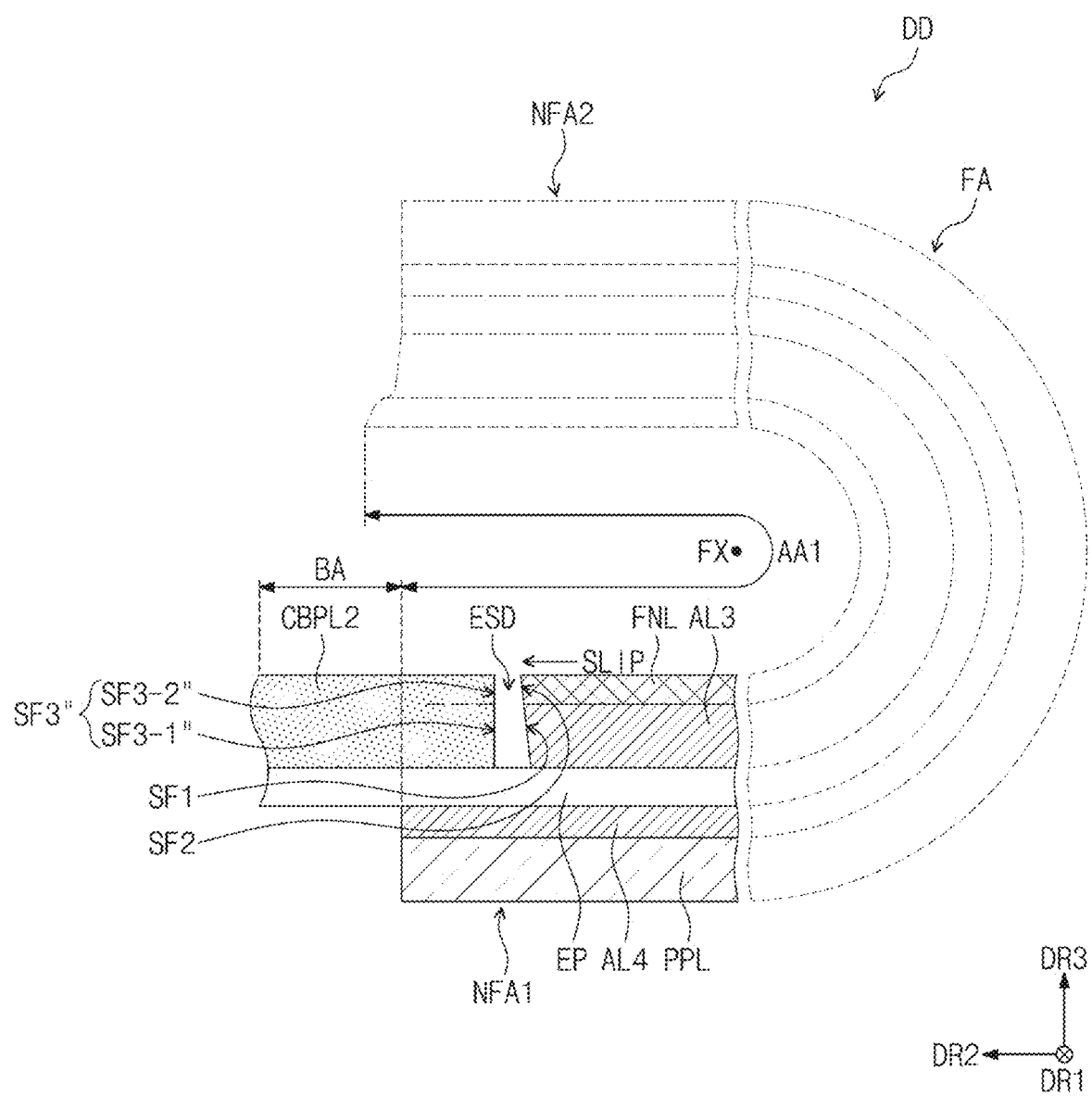
FIG. 11B is a cross-sectional view showing a change occurring upon folding of a display device according to Comparative Example.

FIG. 11A is a cross-sectional view showing a change occurring upon folding of a display device DD according to Comparative Example. FIG. 11B is a cross-sectional view showing a change occurring upon folding of a display device DD according to Comparative Example.

Referring to FIG. 11A, a first comparative bending protection layer CBPL1 may include a third side surface SF3' having a 3-1 side surface SF3-1' in contact with the first side surface SF1 of the third adhesive layer AL3 and a 3-2 side surface SF3-2' in contact with the second side surface SF2 of the functional layer FNL, in original positions thereof where all side surfaces contact. In this case, when the folding region FA is inner-folded, the functional layer FNL and the third adhesive layer AL3 may slip toward the bending region BA. The third adhesive layer AL3 and the functional layer FNL which have slipped to be in slipped positions, may push the first comparative bending protection layer CBPL1.

Since the third adhesive layer AL3 has fluidity, even when the third adhesive layer AL3 pushes the first comparative bending protection layer CBPL1, the first comparative bending protection layer CBPL1 may not be significantly affected. However, when the functional layer FNL having a harder property pushes the first comparative bending protection layer CBPL1, a portion of the first comparative bending protection layer CBPL1 may be peeled off by the force that the functional layer FTL pushes. Although FIG. 11A shows that the first comparative bending protection layer CBPL1 is peeled off in the first region AA1, the first comparative bending protection layer CBPL1 may also be peeled off in the bending region BA. In this case, the lines disposed in the bending region BA may be damaged.

Referring to FIG. 11B, a second comparative bending protection layer CBPL2 may include a third side surface SF3" having a 3-1 side surface SF3-1" spaced apart from the first side surface SF1 of the third adhesive layer AL3 and a 3-2 side surface SF3-2" spaced apart from the second side surface SF2 of the functional layer FNL (e.g., no original contact between the various side surfaces).

In this case, even when the folding region FA is folded to define slipped positions, the first side surface SF1 of the third adhesive layer AL3 that has slipped and the second side surface SF2 of the functional layer FNL that has slipped may each not contact the second comparative bending protection layer CBPL2. However, a separation space between the second comparative bending protection layer CBPL2 and the functional layer FNL, and between the second comparative bending protection layer CBPL2 and the third adhesive layer AL3 may cause the electronic panel EP to be exposed to the outside, and external static electricity ESD to be applied to the electronic panel EP, thereby damaging the electronic panel EP.

The display device DD of the invention includes the bending protection layer BPL having the third side surface SF3 pre-contacting the first side surface SF1 of the third adhesive layer AL3 but spaced apart from the second side surface SF2 of the functional layer FNL, to prevent the functional layer FTL that slips from pushing the protection layer BPL upon the folding of the folding region FA. Accordingly, the protection layer BPL may not be peeled off, and the bending region BA or the first region AA1 to which the protection layer BPL is bonded may not be damaged. In addition, a front surface of the electronic panel EP included in the display device DD is covered by the third adhesive layer AL3 and the bending protection layer BPL in contact with each other, both in the pre-folded (FIGS. 7-9) and the post-folded (FIG. 10) states, and the electronic panel EP may thus not be damaged from static electricity.

Figure 12A:
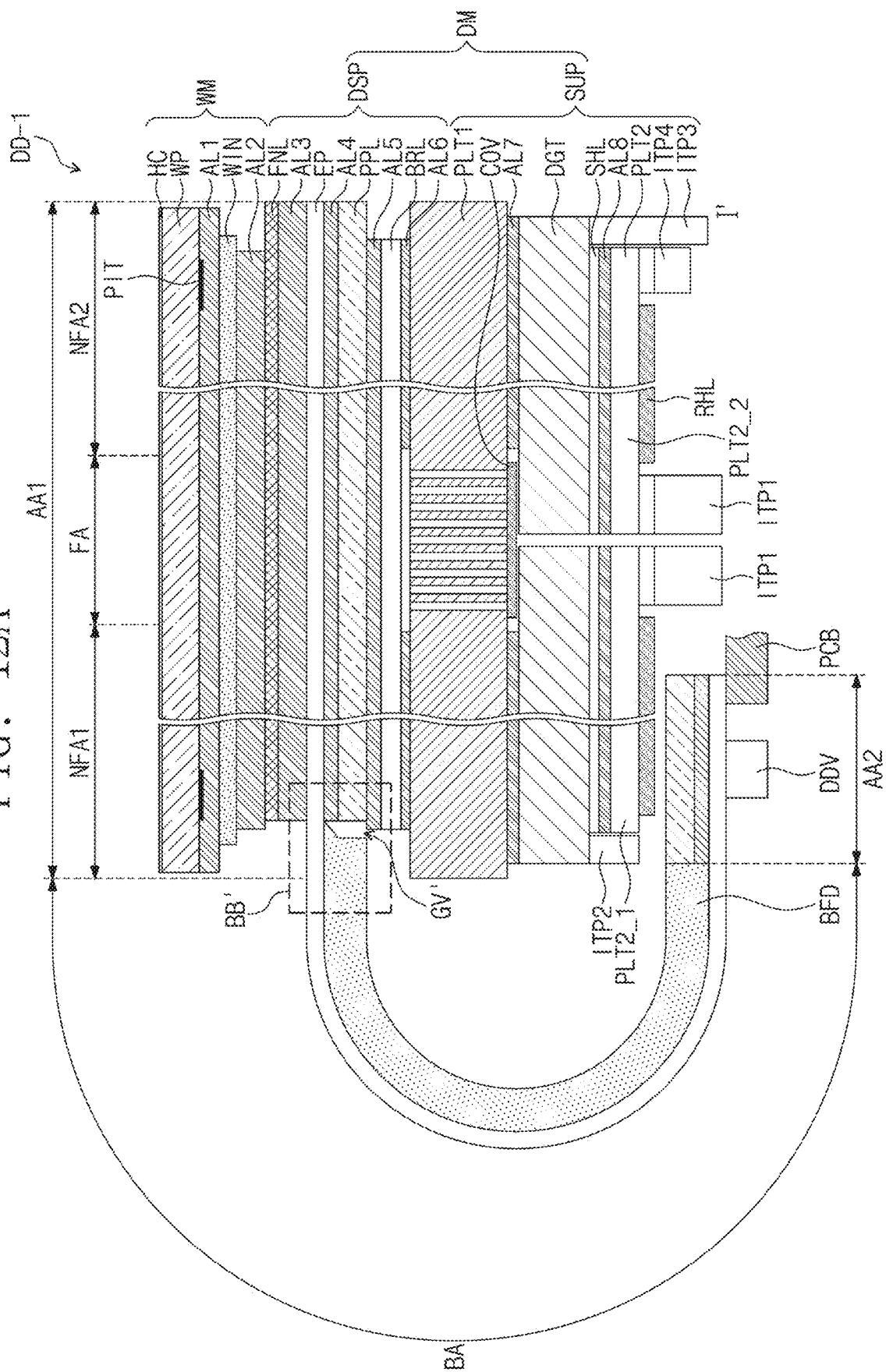
FIG. 12A is a cross-sectional view of a display device according to an embodiment.
Figure 12B:
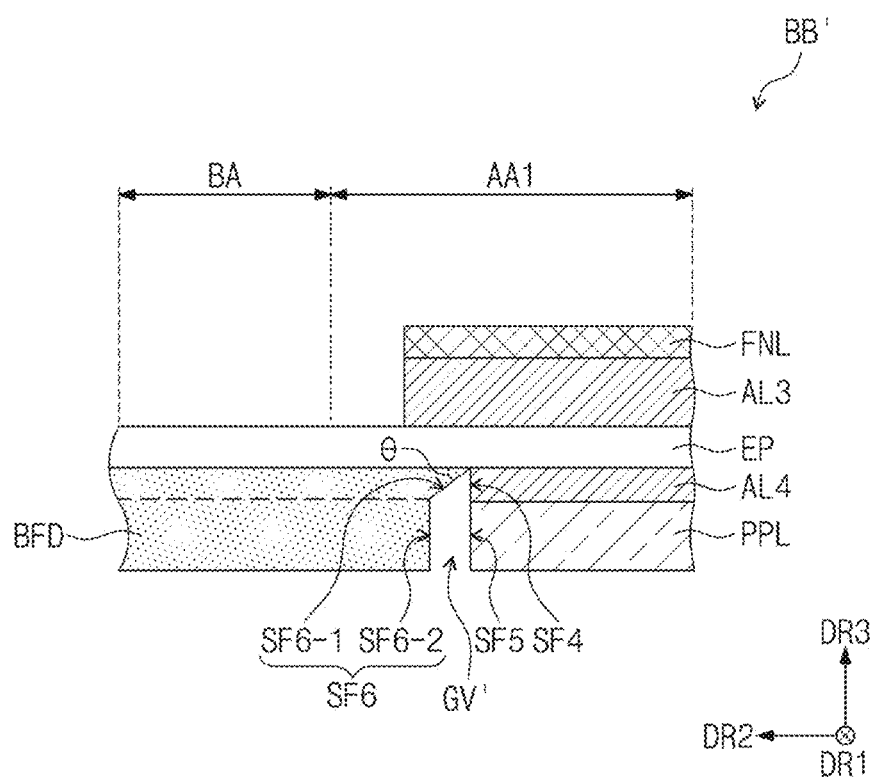
FIG. 12B is an enlarged cross-sectional view of a portion of FIG. 12A.

FIG. 12A is a cross-sectional view of a display device DD-1 according to an embodiment. FIG. 12B is a cross-sectional view enlarging a portion of FIG. 12A.

Referring to FIG. 12A, a display device DD-1 according to an embodiment may include a bending filling layer BFD. The bending filling layer BFD may be disposed below the electronic panel EP and may be disposed at least in the bending region BA. For example, the bending filling layer BFD may be disposed on at least a portion of the first region AA1, the bending region BA, and at least a portion of the second region AA2.

The bending filling layer BFD may face the fourth adhesive layer AL4 and a panel protection layer PPL which are disposed below the electronic panel EP. A groove GV' may be defined between the bending filling layer BFD and the fourth adhesive layer AL4, and between the bending filling layer BFD and the panel protection layer PPL.

Referring to FIG. 12B, the fourth adhesive layer AL4 includes a fourth side surface SF4 that is a side surface adjacent to the bending filling layer BFD, and the panel protection layer PPL includes a fifth side surface SF5 that is a side surface adjacent to the bending filling layer BFD. In a state in which the folding region FA (see FIG. 12A) is not folded, the fourth side surface SF4 may be aligned with the fifth side surface SF5. The bending filling layer BFD may include a sixth side surface SF6 facing the fourth adhesive layer AL4 and the panel protection layer PPL. Specifically, the sixth side surface SF6 may include a 6-1 side surface SF6-1 facing the fourth side surface SF4 and a 6-2 side surface SF6-2 facing the fifth side surface SF5.

In the display device DD-1 which is unfolded, at least a portion of the 6-1 side surface SF6-1 contacts the fourth side surface SF4 at a location closest to the electronic panel EP, and the 6-2 side surface SF6-2 is spaced apart from the fifth side surface SF5. The 6-1 side surface SF6-1 may include an inclined surface forming an inclination angle θ with a lower surface of the electronic panel EP. The inclination angle θ may be greater than 0° and less than 90°.

The relationship between the bending filling layer BFD, the fourth adhesive layer AL4, and the panel protection layer PPL is the same as the relationship between the bending protection layer BPL, the third adhesive layer AL3, and the functional layer FNL described above. When the display device DD (see FIGS. 9 and 10) is inner-folded, side surfaces of the third adhesive layer AL3 and the functional layer FNL are aligned with the side surface of the bending protection layer BPL, at the groove GV (see FIG. 9), and peeling of the bending protection layer BPL is prevented. Likewise, when the display device DD-1 (see FIG. 12A) is outer-folded, the fourth adhesive layer AL4 and the panel protection layer PPL disposed below the electronic panel EP slip toward the bending region BA, and accordingly, side surfaces the fourth adhesive layer AL4 and the panel protection layer PPL are aligned with the side surface of the bending filling layer BFD, at the groove GV', and peeling of the bending filling layer BFD may be prevented.

Hereinafter, a method for manufacturing (or providing) a display device DD according to an embodiment will be described with reference to FIGS. 13 to 14E and the like. In descriptions of the method for manufacturing a display device DD according to an embodiment with reference to FIGS. 13 to 14E, content overlapping the description of the display device DD according to an embodiment in FIGS. 1 to 12 will not be described again, and the differences will be mainly described.

Figure 13:
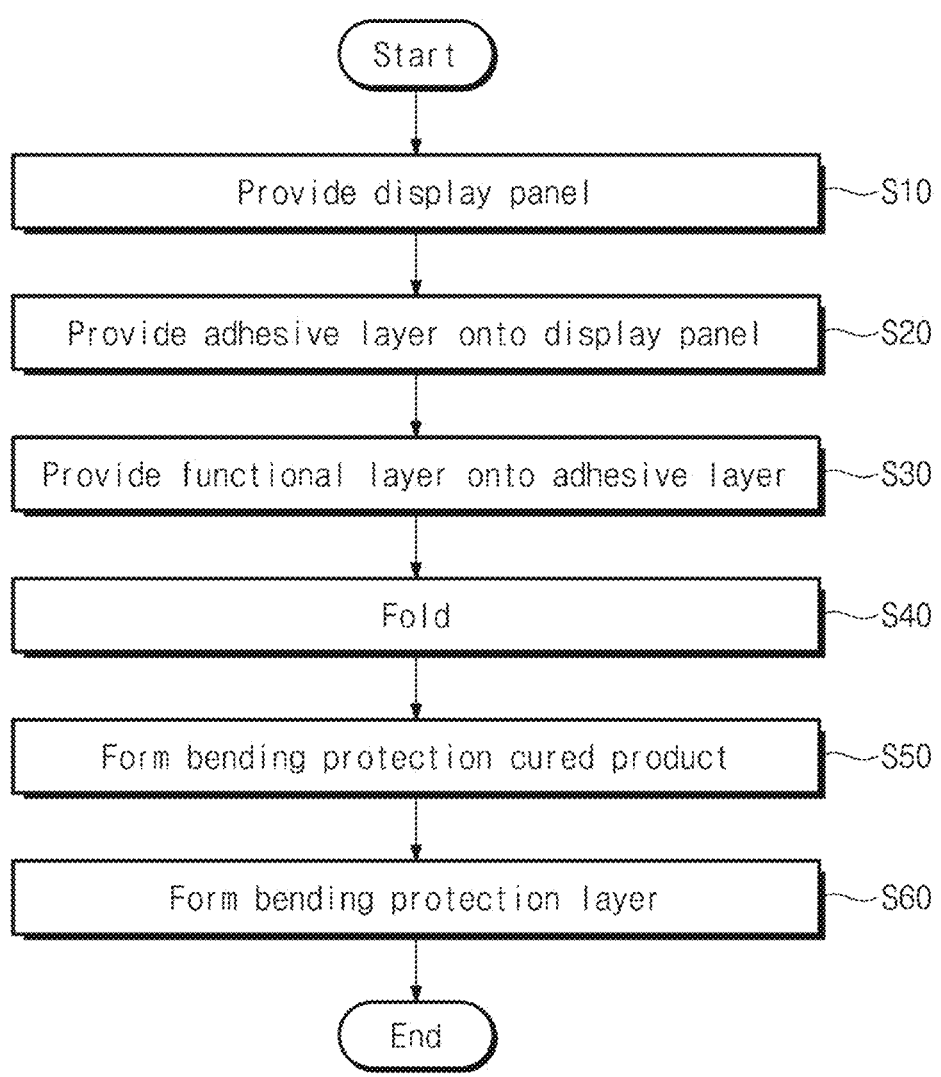
FIG. 13 is a flowchart showing a method for manufacturing (or providing) a display device according to an embodiment.

FIG. 13 is a flowchart showing a method for manufacturing (or providing) a display device DD according to an embodiment.

FIGS. 14A to 14E are views schematically showing some of the processes of a method for manufacturing a display device DD according to an embodiment. Processes of the method for manufacturing a display device DD according to an embodiment shown in FIGS. 14A to 14E may be sequentially performed.

The method for manufacturing a display device DD according to an embodiment may include providing a display panel DP (as represented by the electronic panel EP) (S10), providing an adhesive layer on the display panel DP (S20), providing a functional layer FNL onto the adhesive layer (S30), folding the display panel DP (S40), forming a bending protection cured product (S50), and forming a bending protection layer BPL (S60).

Figure 14A:
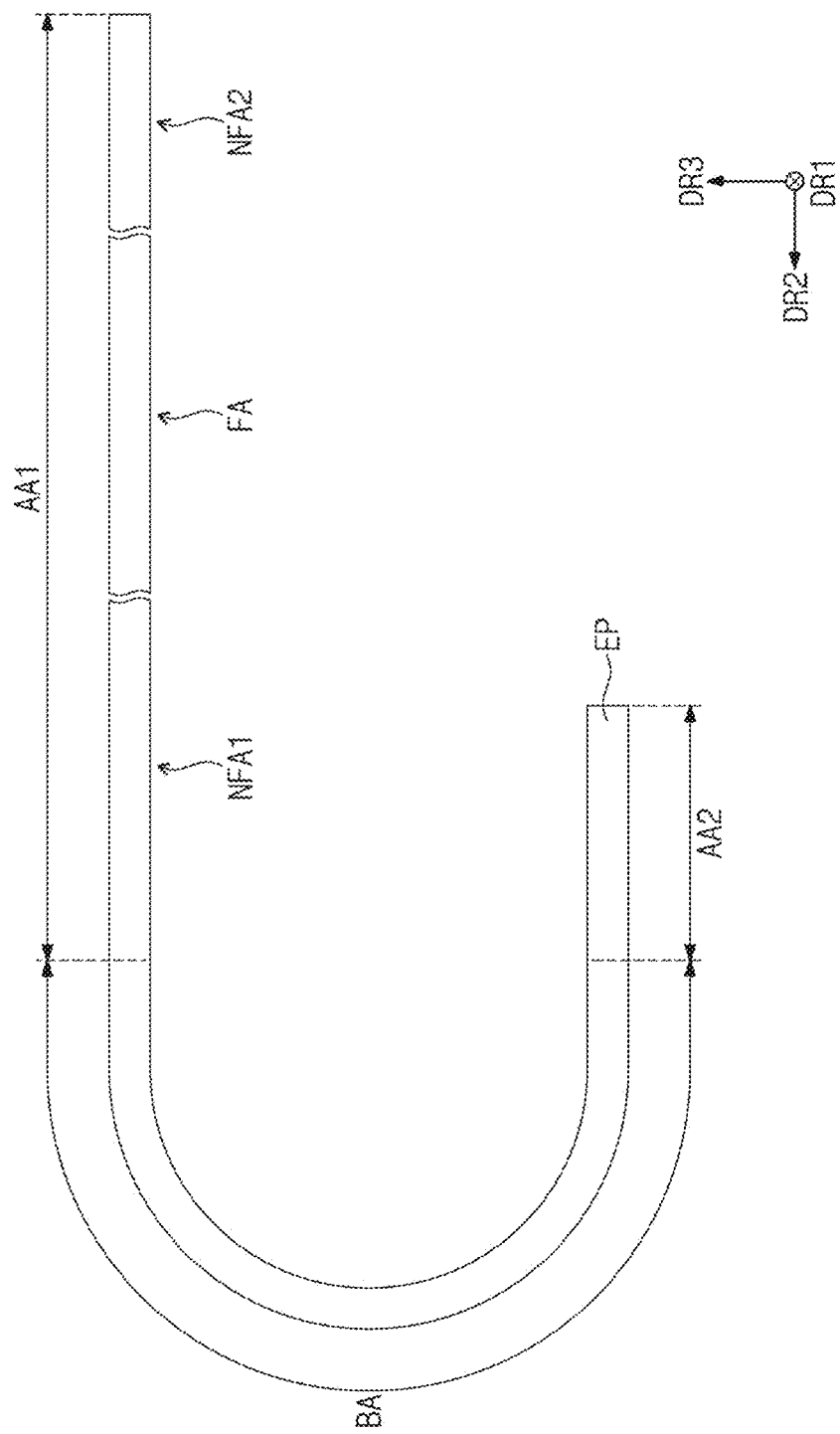

Referring to FIG. 14A, the providing of a display panel DP (S10) may be providing an electronic panel EP in which a first region AA1, a bending region BA, and a second region AA2 are defined. The first region AA1 may include a folding region FA, a first non-folding region NFA1, and a second non-folding region NFA2.

The electronic panel EP may include at least the display panel DP (see FIG. 4). Hereinafter, the description of the electronic panel EP may be equally applied to the display panel DP (see FIG. 4).

Referring to FIG. 14B, the providing of an adhesive layer on the display panel (S20) and the providing of a functional layer on the adhesive layer (S30) may be forming a third adhesive layer AL3 on the electronic panel EP to overlap the first region AA1 when viewed on a plane, and forming a functional layer FNL on the third adhesive layer AL3 to overlap the first region AA1 when viewed on a plane. The third adhesive layer AL3 and the functional layer FNL may overlap the folding region FA, a first non-folding region NFA1, and a second non-folding region NFA2 when viewed on a plane. The display device DD which is unfolded, disposes side surfaces of the third adhesive layer AL3 and the functional layer FNL which are closest to the bending region BA, as aligned with each other. As described above, the third adhesive layer AL3 and/or the functional layer FNL may be slippable in a direction along the display panel DP, by folding of the display device DD at the folding area FA.

Figure 14C:
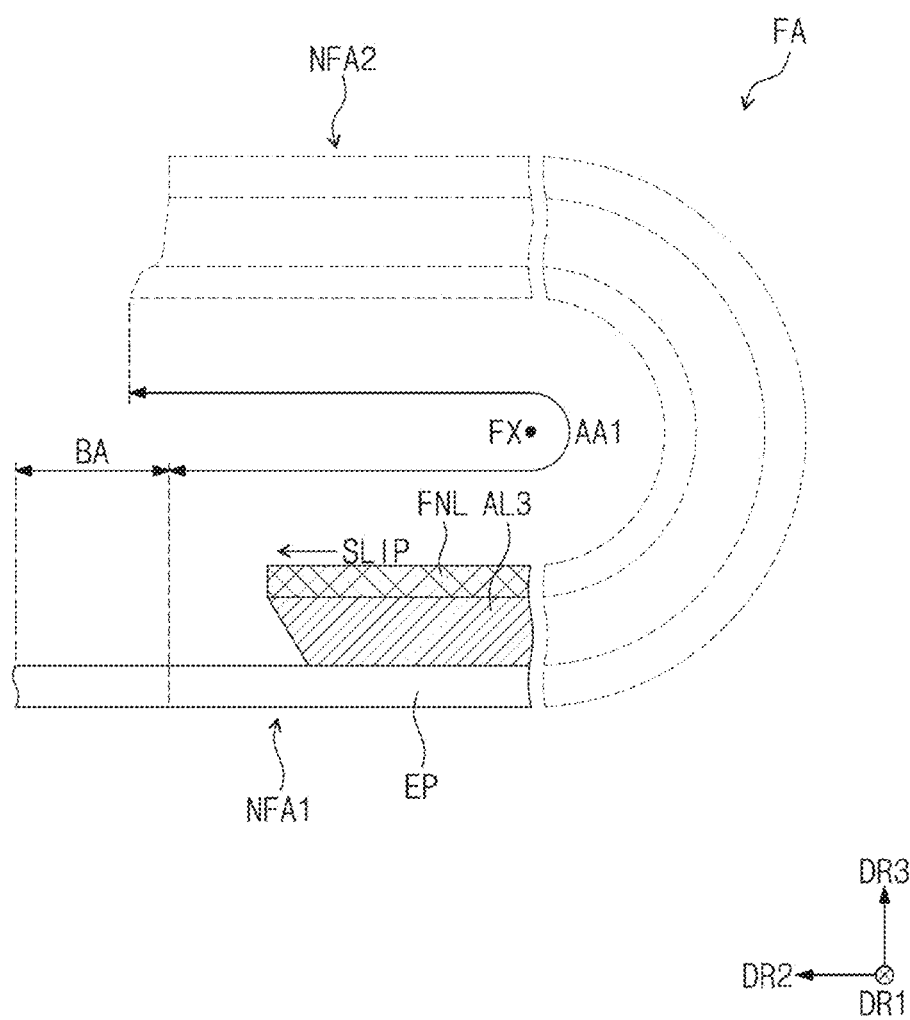

Referring to FIG. 14C, the folding S40 may be folding the first region AA1 of the display device DD including the display panel DP which is bent, with respect to a folding axis FX, to cause the third adhesive layer AL3 and the functional layer FNL to slip in the second direction DR2 as a direction toward a bending region BA which is bent. The third adhesive layer AL3 and the functional layer FNL disposed above the electronic panel EP in the stacked structure including the electronic panel EP, the third adhesive layer AL3 and the function layer FNL, slip in the second direction DR2, as the folding region FA is inner-folded. The display device DD which is folded, disposes side surfaces of the third adhesive layer AL3 and the functional layer FNL which are closest to the bending region BA, as un-aligned with each other. The slipped position of the third adhesive layer AL3 and the functional layer FNL includes the third adhesive layer AL3 inwardly-inclined from the functional layer FNL to the electronic panel EP, to dispose the side surface of the functional layer FNL closer to the bending region BA than the third adhesive layer AL3.

Figure 14D:
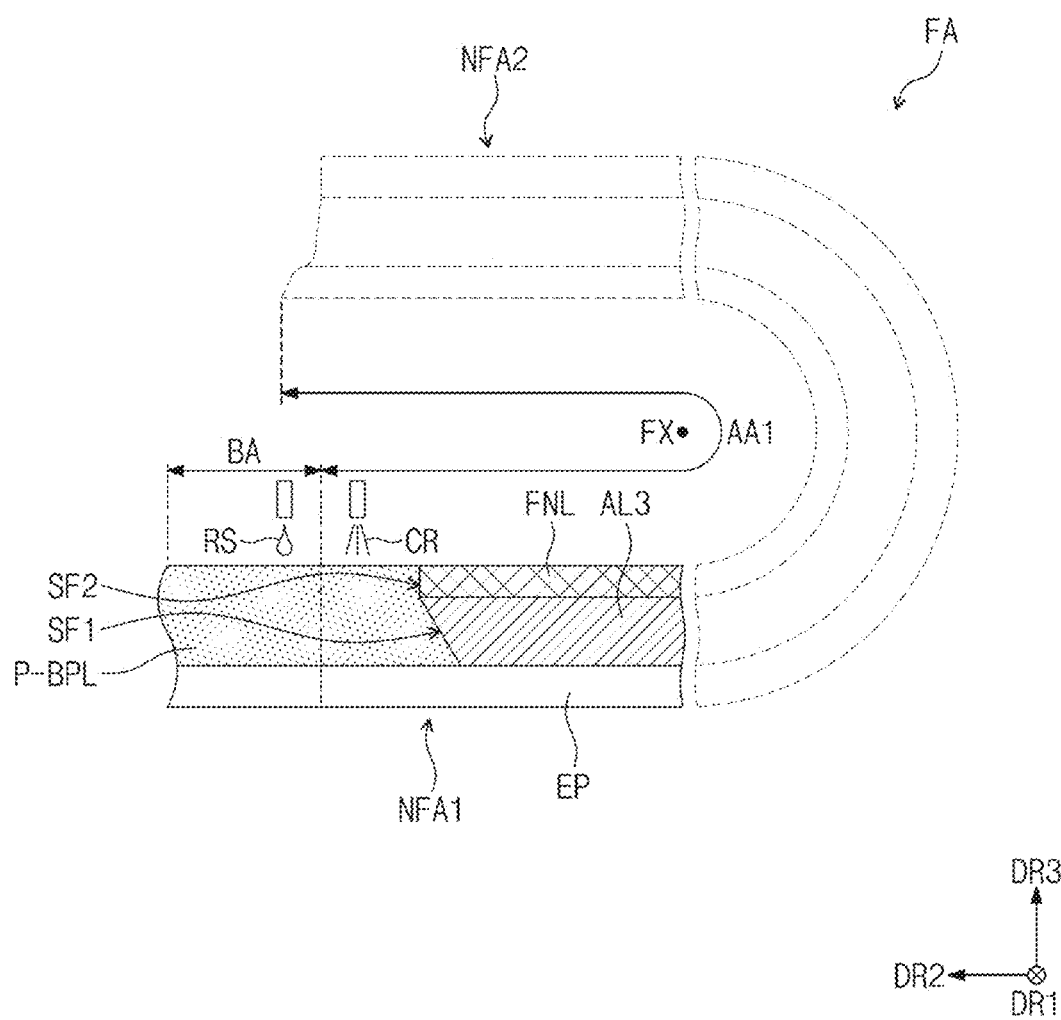

Referring to FIG. 14D, the forming of a bending protection cured product (S50) may be providing and curing CR a bending protection resin RS (e.g., bending protection material), on a first side surface SF1 of the third adhesive layer AL3 that has slipped and on a second side surface SF2 of the functional layer FNL that has slipped.

The bending protection resin RS may include an epoxy-based resin, an acrylic resin, a urethane-based resin, or a urethane acrylate-based resin. For example, the bending protection resin RS may include an acrylic resin or a urethane-based resin.

The bending protection resin RS may be provided up to at least a portion of the second region AA2 through the first region AA1 and the bending region BA from the first side surface SF1 that has slipped and the second side surface SF2 that has slipped. The bending protection resin RS may be provided on the electronic panel EP through a nozzle or the like. The provided bending protection resin RS may be cured CR to become a bending protection cured product P-BPL.

Figure 14E:
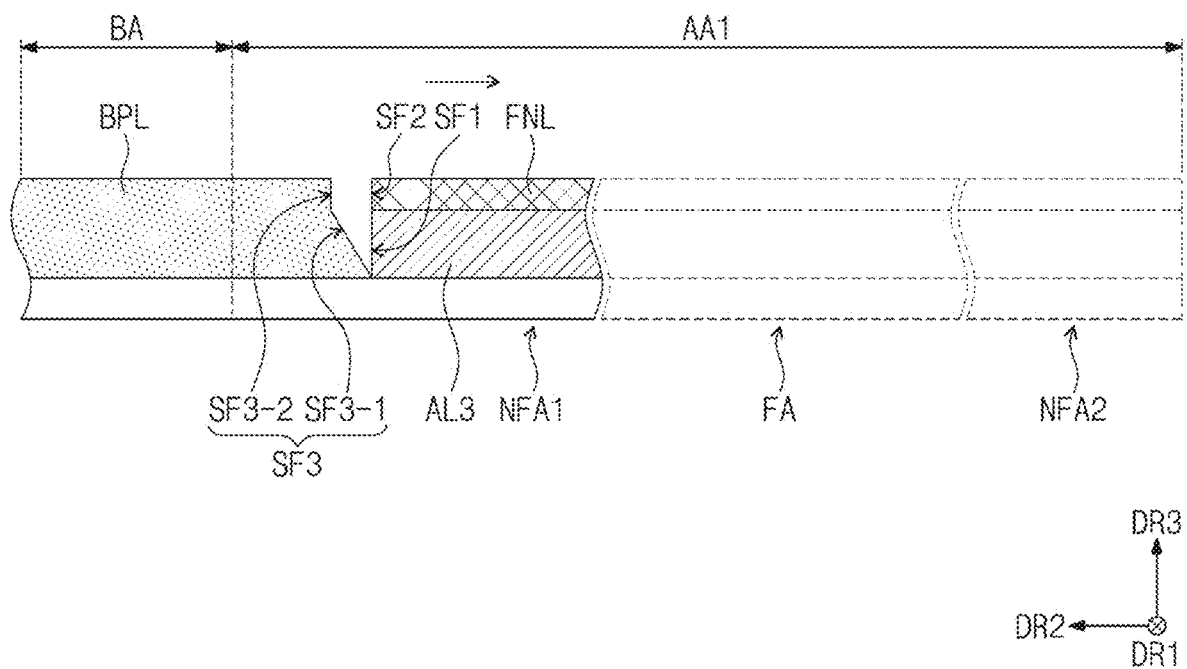

Referring to FIG. 14E, the forming of a bending protection layer (S50) may include non-folding the first region AA1 to provide the display device DD which us unfolded, to move the third adhesive layer AL3 and the functional layer FNL in a direction opposite to the second direction DR2. When the folding region FA is unfolded after the forming (or providing) of a bending protection cured product P-BPL in FIG. 14D, the third adhesive layer AL3 and the functional layer FNL return to the positions before folding as shown in FIG. 14B, where the positions include side surfaces aligned with each other. Accordingly, the display device DD which is unfolded disposes the bending protection cured product P-BPL (see FIG. 14) separated from the functional layer FNL and in contact with the third adhesive layer AL3, and the bending protection layer BPL may be formed.

As shown in FIG. 14D, since the bending protection resin RS is provided on the first side surface SF1 that has slipped and the second side surface SF2 that has slipped and cured, a shape of a 3-2 side surface SF3-2 of the bending protection layer BPL may be formed to be the same as the shape of the second side surface SF2 of the functional layer FNL. FIG. 14E shows that the shape of the 3-2 side surface SF3-2 is a vertical surface, but it is suitable as long as the shape of the 3-2 side surface SF3-2 is the same as the shape of the second side surface SF2 and the shape is not limited to the vertical surface. Shape of a 3-1 side surface SF3-1 of the bending protection layer BPL may be slightly different from the shape of the first side surface SF1 of the third adhesive layer AL3. In addition, at least a portion of the 3-1 side surface SF3-1 of the bending protection layer BPL contacts the first side SF1 of the third adhesive layer AL3, owing to the third adhesive layer AL3 having greater fluidity than the functional layer FNL.

In an embodiment, a method of providing a display device DD may include providing a display panel DP including a first region AA1 corresponding to a folding region FA of an unfolded display device (FIGS. 14A and 14B), and a bending region BA which is extended from the first region AA1 in a direction (e.g., second direction DR2) and at which the display panel DP is bent (FIGS. 14A and 14B), providing on the display panel DP which is bent, in the unfolded display device, an adhesive layer (e.g., third adhesive layer AL3 in FIG. 14B) overlapping the folding region FA, and a functional layer FNL on the adhesive layer and overlapping the folding region FA, folding the display panel DP which is bent, together with the adhesive layer and the functional layer FNL, at the folding region, to define a folded display device (FIG. 14C). The folding both slides the adhesive layer and the functional layer FNL together with each other, along the display panel DP and in the first direction (FIG. 14B to FIG. 14C), and disposes each of the adhesive layer and the functional layer FNL which is slid, to include a side surface closest to the bending region BA (FIG. 14C). The method may further include providing a cured first bending protection resin (e.g., bending protection BPL in FIG. 14D) onto the side surface of the adhesive layer and the side surface of the functional layer FNL, within the folded display device, to provide a bending protection layer BPL of the display device DD, and unfolding the display panel DP which is bent, together with the adhesive layer and the functional layer FNL, at the folding region, to provide the display device DD (FIG. 14E). The unfolding (FIG. 14D to FIG. 14E) slides the adhesive layer and the functional layer FNL together with each other, along the display panel DP, and in an opposite direction (e.g., opposite to the second direction DR2).

In the method for manufacturing a display device DD according to an embodiment of the invention, in a folded state of the display device DD, a bending protection resin RS is provided on each functional layer side surface and the adhesive layer and cured to form a bending protection layer BPL. Accordingly, even when the functional layer FNL and the adhesive layer slip upon the folding of a manufactured display device, the bending protection layer BPL is not pushed by the pushing force of the slipped functional layer and the slipped adhesive layer, and the functional layer and the adhesive layer which have slipped may be aligned with the bending protection layer BPL. The display device DD according to an embodiment of the invention may prevent peeling of the bending protection layer BPL and prevent damage to a bending region BA of the display panel DP on which the bending protection layer BPL is disposed. In addition, the bending protection layer BPL partially contacts the adhesive layer disposed on the electronic panel EP, and the electronic panel EP may thus be protected from external static electricity.

Figure 15:
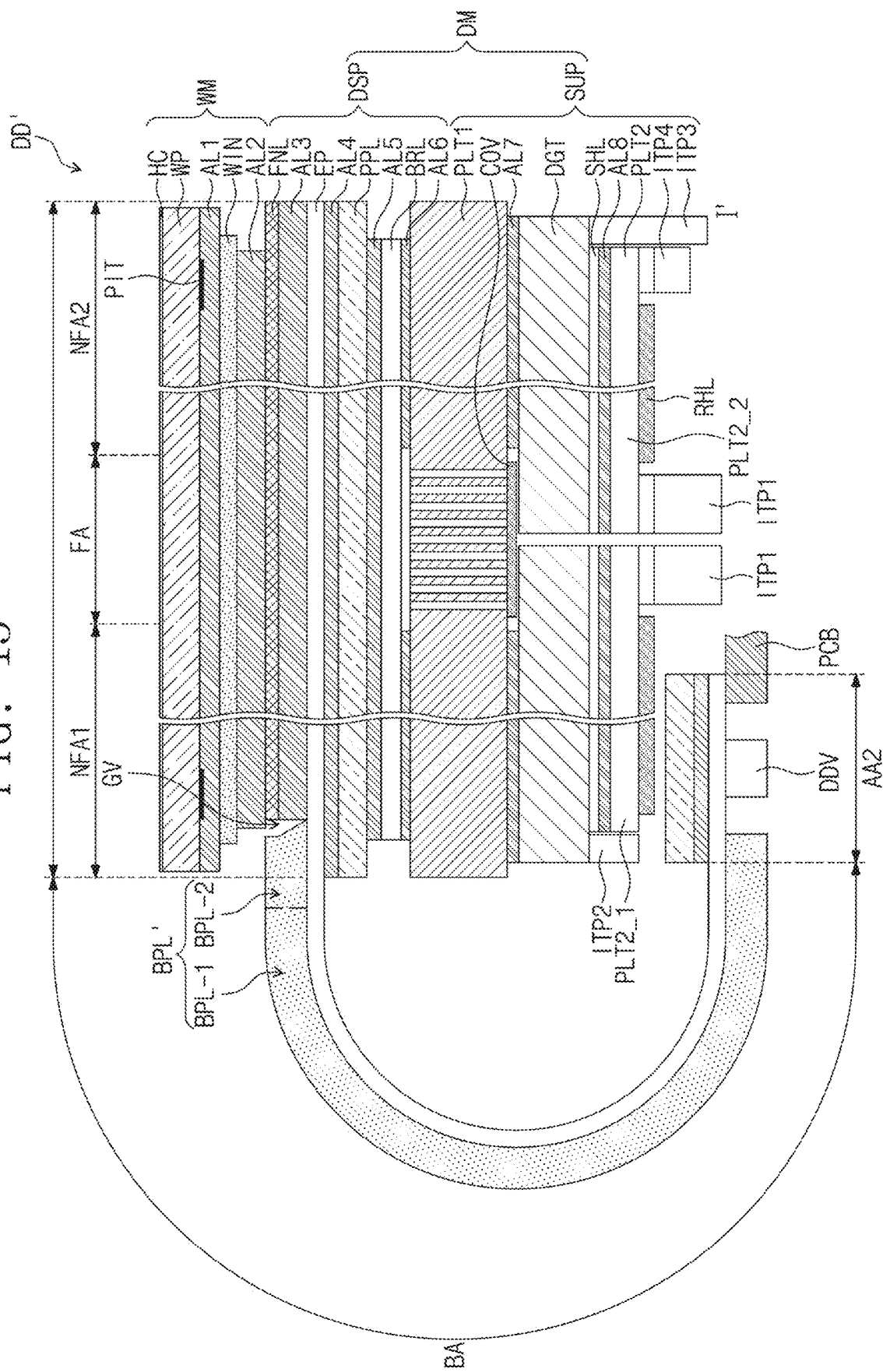
FIG. 15 is a cross-sectional view of a display device according to an embodiment.

FIG. 15 is a cross-sectional view of a display device DD' according to an embodiment.

Referring to FIG. 15, a display device DD' according to an embodiment may include a bending protection layer BPL' including different types of resins. The bending protection layer BPL' may include a first bending protection layer BPL-1 formed of a first resin and a second bending protection layer BPL-2 formed of a second resin different from the first resin. A modulus of the first bending protection layer BPL-1 may be greater than a modulus of the second bending protection layer BPL-2. A groove GV is present between the bending protection layer BPL', and each of the third adhesive layer AL3 and the functional layer FNL, respectively.

The bending protection layer BPL' according to an embodiment may be formed by first forming the first bending protection layer BPL-1 with a first resin and then forming the second bending protection layer BPL-2 with a second resin.

For detailed descriptions, refer to FIGS. 16A to 16E. In descriptions of the method for manufacturing a display device DD' according to an embodiment with reference to FIGS. 15 to 16E, content overlapping the description of the display device DD according to an embodiment in FIGS. 1 to 14E will not be described again, and the differences will be mainly described.

The method for manufacturing a display device DD' according to an embodiment may further include forming a pre-cured product, between the providing of a functional layer (S30) of FIG. 14B and the folding of the display device DD' (S40) of FIG. 14C.

Figure 16A:
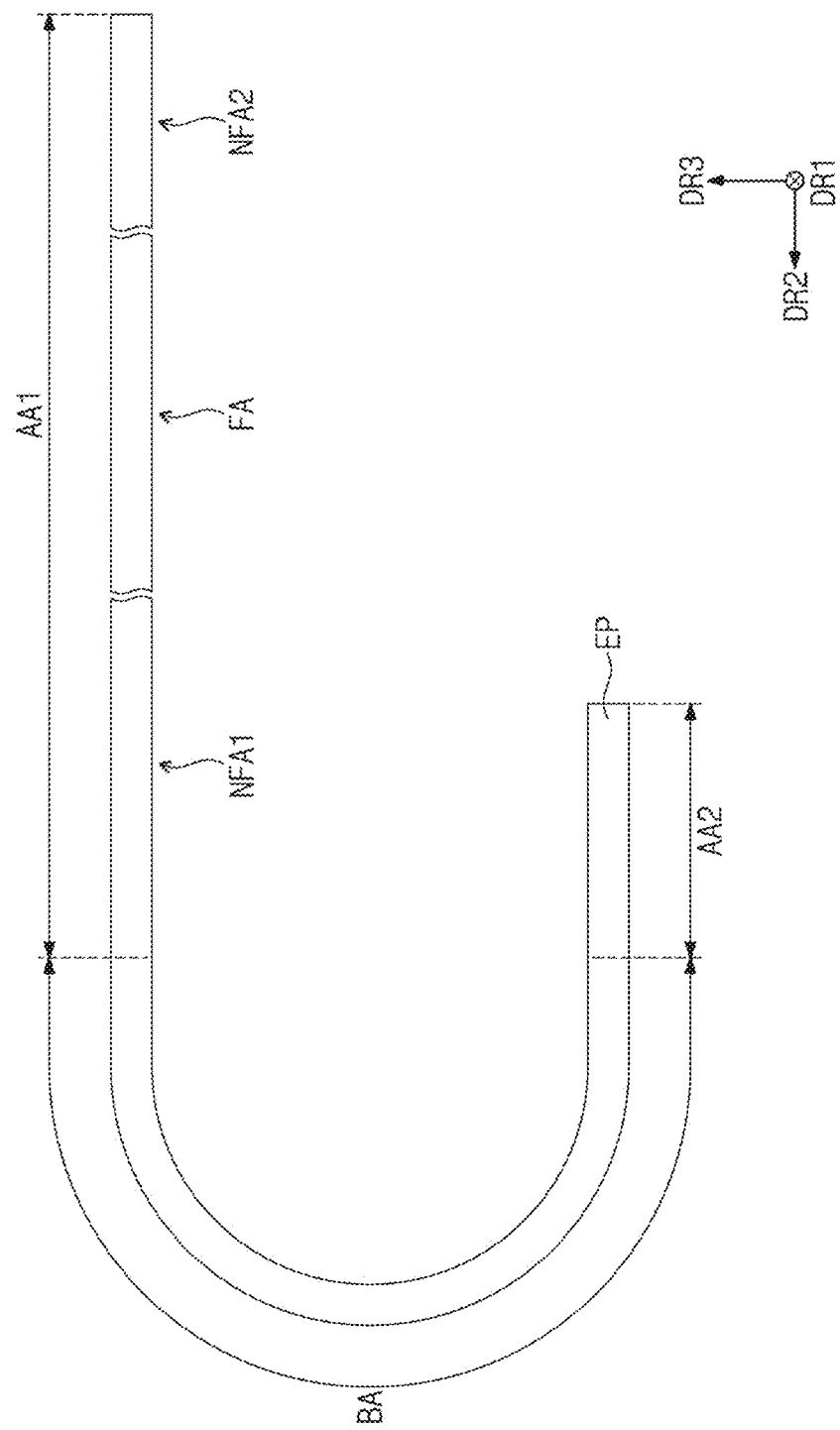

FIG. 16A is providing a display panel DP (S10).

Figure 16B:
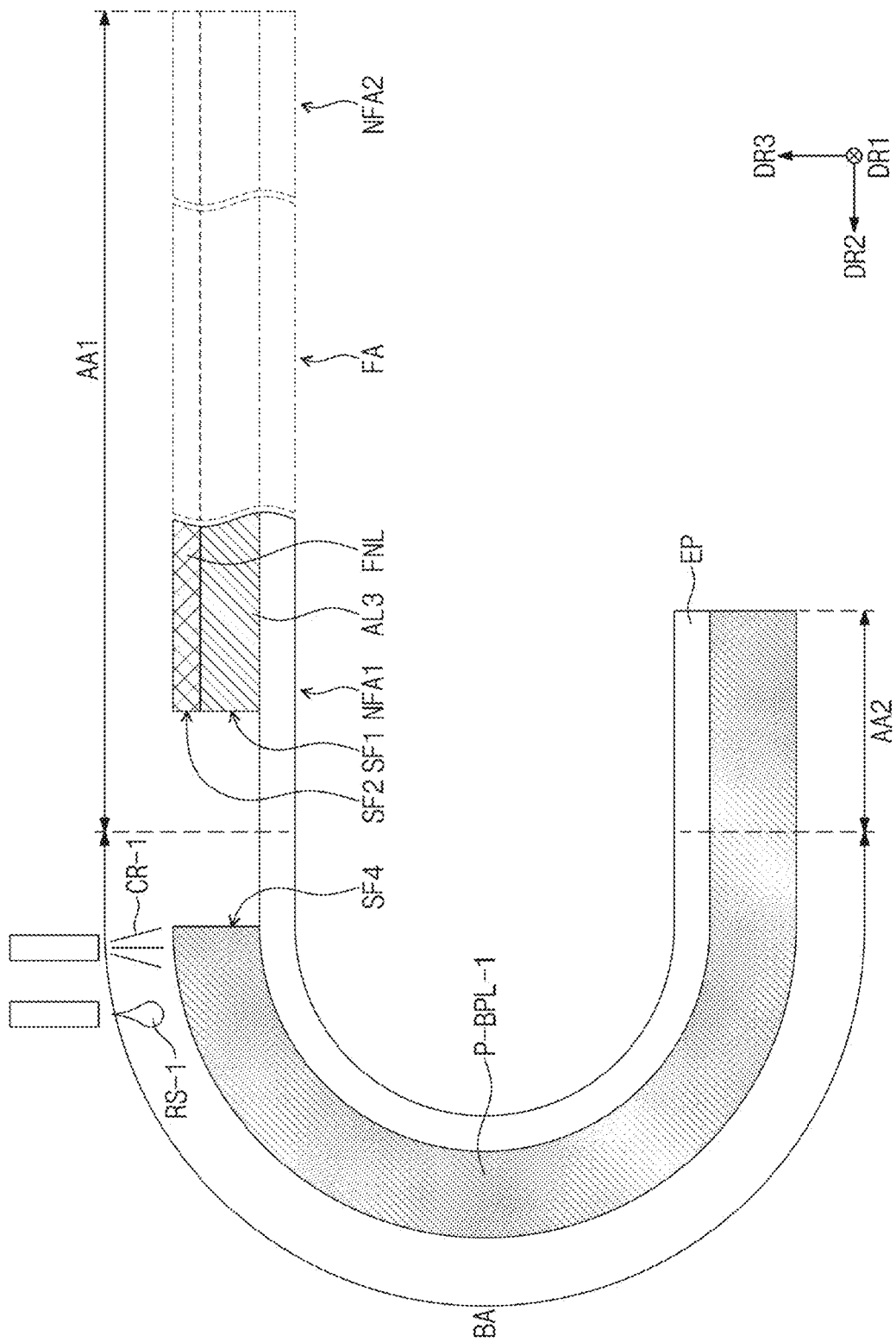

FIG. 16B shows providing an adhesive layer on the display panel DP (S20), providing a functional layer FNL onto the adhesive layer (S30), and forming a pre-cured product B-BPL-1.

Referring to FIG. 16B, the forming of a pre-cured product B-BPL-1 includes providing a first resin RS-1 to a bending region BA and a second region AA2, and curing CR-1 in a state in which the folding region FA of the display device DD' is not folded, after forming the third adhesive layer AL3 and the functional layer FNL on the electronic panel EP.

The first resin RS-1 may be continuously provided from at least a portion of the bending region BA up to at least a portion of the second region AA2. The first resin RS-1 may be cured CR-1 to form a pre-cured product P-BPL-1.

Figure 16C:
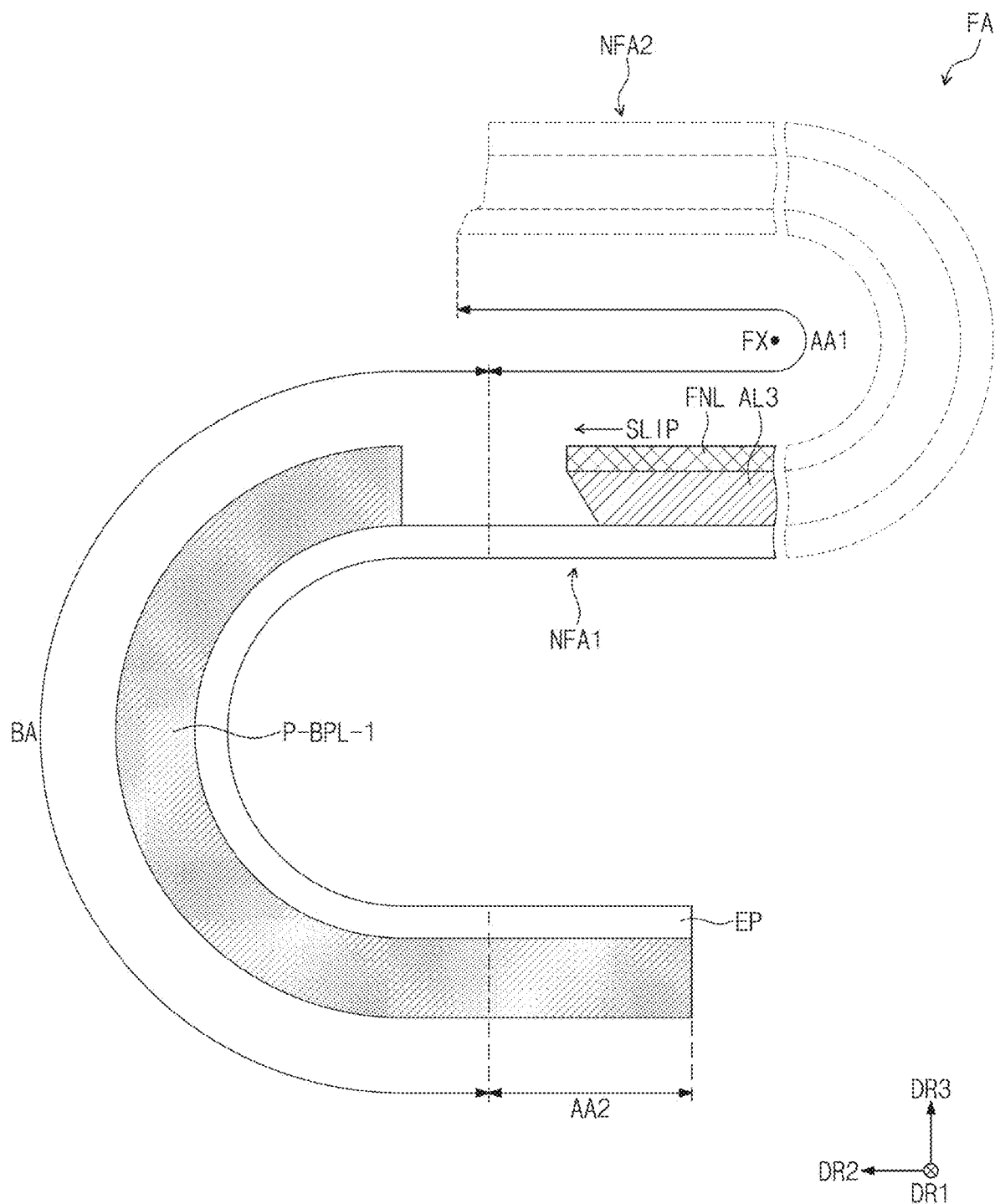

FIG. 16C shows folding of the stacked structure at the folding region FA (S40).

Referring to FIG. 16C, after the forming of a pre-cured product P-BPL-1, the folding region FA is folded with respect to a folding axis FX. In this case, the third adhesive layer AL3 and the functional layer FNL may slip in a direction of the bending region BA.

Figure 16D:
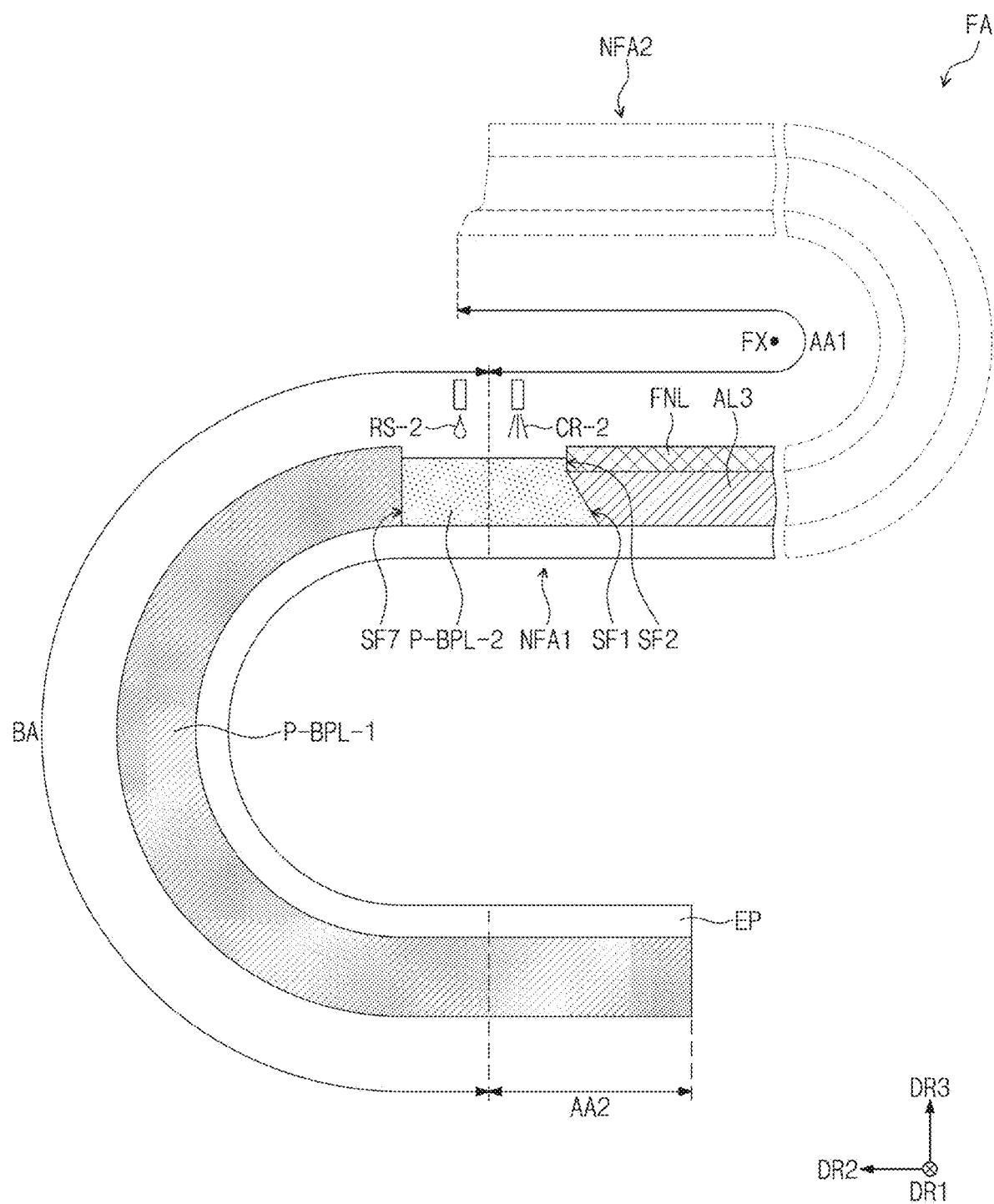

FIG. 16D shows forming a bending protection cured product P-BPL-2 (S50).

Referring to FIG. 16D, a second resin RS-2 is provided and cured CR-2 from the first side surface SF1 of the adhesive layer that has slipped and the second side surface SF2 of the functional layer FNL that has slipped, to a seventh side surface SF7, which is a side surface of the pre-cured product P-BPL-1. The second resin RS-2 may have a lower modulus than the first resin RS-1. The second resin RS-2 may be cured CR-2 to form a bending protection cured product P-BPL-2. The bending protection cured product P-BPL-2 may have a lower modulus than the pre-cured product P-BPL-1.

FIG. 16E show forming a bending protection layer BPL S60.

Referring to FIG. 16E, the forming of a bending protection layer BPL (S60) may include non-folding the first region AA1 to move the third adhesive layer AL3 and the functional layer FNL in a direction opposite to the second direction DR2.

When the folding region FA is unfolded after the forming of a bending protection cured product P-BPL-2 in FIG. 16D, the third adhesive layer AL3 and the functional layer FNL return to the positions before folding as shown in FIG. 14B. Accordingly, the bending protection cured product P-BPL-2 is separated from the third adhesive layer AL3 and the functional layer FNL, and a bending protection layer BPL' including a first bending protection layer BPL-1 and a second bending protection layer BPL-2 may be formed. The first bending protection layer BPL-1 may correspond to or be a cured form of the pre-cured product P-BPL-1 and the second bending protection layer BPL-2 may correspond to or be a cured form of the bending protection cured product P-BPL-2.

A thickness WD2 of the second bending protection layer BPL-2 which is closer to the functional layer FNL, may be greater than a thickness WD1 of the first bending protection layer BPL-1. This is to minimize shocks between the functional layer FNL and the bending protection layer BPL'.

As shown in FIG. 16D, since the second resin RS-2 is provided on the first side surface SF1 that has slipped and the second side surface SF2 that has slipped, and cured, shape of a 3-2 side surface SF3-2' of the bending protection layer BPL' may be formed to be the same as the shape of the second side surface SF2 of the functional layer FNL. FIG. 16E shows that the shape of the 3-2 side surface SF3-2' is a vertical surface, but it is suitable as long as the shape of the 3-2 side surface SF3-2' is the same as the shape of the second side surface SF2 and the shape is not limited to the vertical surface. Shape of a 3-1 side surface SF3-1' of a bending protection layer BPL' may be slightly different from the shape of the first side surface SF1 of the third adhesive layer AL3. In addition, at least a portion of the 3-1 side surface SF3-1' of the bending protection layer BPL' contacts the first side SF1 of the third adhesive layer AL3. This is because the third adhesive layer AL3 has greater fluidity than the functional layer FNL.

In an embodiment, a method may include the display panel DP further including the first region AA1, the bending region BA and a second region AA2 in order in the direction (e.g., the second direction DR2), the unfolded display device (FIGS. 16A and 16B) includes each of the adhesive layer and the functional layer FNL having a non-slid side surface which is closest to the bending region BA (e.g., the first side surface SF1 and the second side surface SF2, in FIG. 16B), and the providing of the bending protection layer BPL includes before the folding, providing a cured second bending protection resin (e.g., the pre-cured product P-BPL-1) spaced apart from the non-slid side surfaces of the adhesive layer and the functional layer FNL and extending to the second region AA2, within the unfolded display device (FIG. 16B), and after the folding (FIG. 16C), providing the cured first bending protection resin (e.g., the bending protection cured product P-BPL-2) between the cured second bending protection resin, and each of the side surface of the adhesive layer and the side surface of the functional layer FNL, within the folded display device (FIG. 16D) where the cured first bending protection resin has a higher modulus than the cured second bending protection resin.

The method for manufacturing a display device DD' according to an embodiment may provide a display device DD' in which shocks between a functional layer FNL and an adhesive layer, and a bending protection layer BPL' are minimized by forming a bending protection layer BPL' including different types of resins.

A display device DD according to an embodiment of the invention may prevent damage to a display panel DP from external static electricity and prevent peeling of a bending protection layer BPL upon folding. In addition, in the method for manufacturing a display device DD according to an embodiment of the invention, in a folded state of the display device DD, a bending protection resin RS is provided on each functional layer side surface and the adhesive layer and cured to form a bending protection layer BPL. Accordingly, even when the functional layer FNL and the adhesive layer slip upon the folding of a manufactured display device, the bending protection layer BPL is not pushed by the force, and the functional layer FNL and the adhesive layer which have slipped may be aligned with the bending protection layer BPL. The display device DD according to an embodiment of the invention may prevent peeling of the bending protection layer BPL and prevent damage to a bending region BA of the display panel DP on which the bending protection layer BPL is disposed. In addition, at least a portion of the bending protection layer BPL contacts the adhesive layer disposed on the electronic panel EP (as representing the display panel DP, for example), and the electronic panel EP may thus be protected from external static electricity.

A display device DD according to an embodiment may be protected from static electricity, and may exhibit reduction in defects in a bending portion, which are caused upon folding and the like.

A method for manufacturing (or providing) a display device DD according to an embodiment may provide a display device DD having excellent reliability.

Although the present disclosure has been described with reference to a embodiments of the invention, it will be understood that the invention should not be limited to these embodiments but various changes and modifications can be made by those skilled in the art without departing from the spirit and scope of the present disclosure.

Accordingly, the technical scope of the invention is not intended to be limited to the contents set forth in the detailed description of the specification, but is intended to be defined by the appended claims.

What is claimed is:

1. A display device comprising:
    a display panel including a first region, a bending region and a second region in order in a first direction, the bending region having a predetermined radius of curvature;
    an adhesive layer disposed on the display panel and overlapping the first region, the adhesive layer comprising a first side surface;
    a functional layer disposed on the adhesive layer and overlapping the first region, the functional layer comprising a second side surface; and
    a bending protection layer disposed on the display panel and overlapping the bending region, the bending protection layer comprising a third side surface coplanar with and directly opposite to each of the first side surface and the second side surface along the first direction,
    wherein the adhesive layer is in contact with the bending protection layer at the third side surface together with the functional layer being spaced apart from the third side surface of the bending protection layer along the first direction.

2. The display device of claim 1, wherein the third side surface of the bending protection layer includes:
    3-1 side surface coplanar with and directly opposite to the first side surface of the adhesive layer and a 3-2 side surface coplanar with and directly opposite to the second side surface of the functional layer; and
    a shape of the second side surface is the same as a shape of the 3-2 side surface.

3. The display device of claim 2, wherein
    the 3-1 side surface of the bending protection layer comprises an inclined surface forming an inclination angle with the display panel, and
    the inclination angle is greater than 0° and less than about 90°.

4. The display device of claim 2, wherein
    the first region comprises a first non-folding region, a second non-folding region, and a folding region disposed between the first non-folding region and the second non-folding region, and when the folding region is folded with respect to a folding axis, the first side surface is aligned with the 3-1 side surface, and the second side surface is aligned with the 3-2 side surface.

5. The display device of claim 1, wherein
the display panel comprises a base layer, a circuit layer and a light emitting element layer disposed on the circuit layer, and
the adhesive layer and the functional layer are on the light emitting element layer.

6. The display device of claim 5, further comprising an input sensor between the display panel and the adhesive layer.

7. The display device of claim 5, wherein the functional layer comprises an anti-reflection layer.

8. The display device of claim 5, wherein the functional layer comprises a shock absorbing layer.

9. The display device of claim 5, further comprising a window on the functional layer.

10. The display device of claim 1, wherein
the display panel comprises a base layer, a circuit layer disposed below the base layer, and a light emitting element layer disposed below the circuit layer, and
the adhesive layer and the functional layer are on the base layer.

11. The display device of claim 10, wherein the functional layer comprises a panel protection layer.

12. The display device of claim 10, further comprising a cover layer, a support portion, a digitizer or a heat dissipation layer, which faces the display panel with both the adhesive layer and the functional layer therebetween.

13. The display device of claim 1, wherein the display panel further comprises pixels overlapping the first region, and a driver overlapping the second region and connected to the pixels.

14. A display device comprising:
a display panel including a first region, a bending region and a second region in order in a first direction, the bending region having a predetermined radius of curvature;
a functional layer disposed on the display panel and overlapping the first region; and
a bending protection layer disposed on the display panel and overlapping the bending region;
wherein
the functional layer includes a functional layer side surface closest to the bending protection layer along the first direction,
the bending protection layer includes a bending protection layer side surface coplanar with and directly opposite to the functional layer side surface along the first direction,
the first region operates in any one of a folding mode which enables folding around a folding axis and a non-folding mode which enables unfolding to be flat,
in the folding mode, the bending protection layer side surface is aligned with the functional layer side surface,
in the non-folding mode, the bending protection layer side surface is spaced apart from the functional layer side surface along the first direction, and
in the folding mode and in the non-folding mode, a shape of the bending protection layer side surface is the same as a shape of the functional layer side surface.

15. The display device of claim 14, further comprising an adhesive layer between the display panel and the functional layer,
wherein
the adhesive layer includes an adhesive layer side surface coplanar with and directly opposite to the bending protection layer side surface along the first direction, and
in each of the folding mode and the non-folding mode, the adhesive layer side surface is in contact with the bending protection layer side surface.

16. The display device of claim 15, wherein the adhesive layer side surface comprises an inclined surface.

17. A method for manufacturing a display device, the method comprising:
providing a display panel including a first region, a second region, and a bending region disposed between the first region and the second region and having a predetermined radius of curvature;
providing an adhesive layer onto the display panel to overlap the first region;
providing a functional layer onto the adhesive layer to overlap the first region;
folding the first region with respect to a folding axis to make the adhesive layer and the functional layer slip in a first direction that is a direction of the bending region;
providing a bending protection resin onto a side surface of the adhesive layer that has slipped and a side surface of the functional layer that has slipped and curing the bending protection resin to form a bending protection cured product; and
non-folding the first region to move the adhesive layer and the functional layer in a second direction opposite to the first direction and form a bending protection layer.

18. The method of claim 17, wherein within the display device, the functional layer is spaced apart from the bending protection layer, and the adhesive layer is in contact with the bending protection layer.

19. The method of claim 17, wherein the forming of a bending protection cured product is providing and curing the bending protection resin from the side surface of the adhesive layer that has slipped and the side surface of the functional layer that has slipped to at least a portion of the second region through the bending region on the display panel.

20. The method of claim 17, further comprising forming a pre-cured product between the providing of a functional layer and the folding,
wherein
the forming of a pre-cured product is providing a pre-resin having a higher modulus than the bending protection resin to the bending region and the second region and curing the pre-resin, and
the forming of a bending protection cured product is providing the bending protection resin from the side surface of the adhesive layer that has slipped and the side surface of the functional layer that has slipped to a side surface of the pre-cured product.

21. The method of claim 20, wherein the cured second bending protection resin of the bending protection layer has a smaller thickness than the cured first bending protection resin of the bending protection layer.

22. The method of claim 17, wherein the functional layer comprises an anti-reflection layer, a shock absorbing layer, or a panel protection layer.

23. A display device comprising:
a folding region at which the display device is foldable;
a display panel including a first region corresponding to the folding region, and a bending region extended from the first region and at which the display panel is folded;

an adhesive layer on the display panel, and overlapping the folding region and the first region;

a functional layer on the adhesive layer, and overlapping the folding region and the first region; and a bending protection layer on the display panel and overlapping the bending region;

wherein the display device which is unfolded at the folding region, disposes:

the adhesive layer in contact with the bending protection layer, and the functional layer spaced apart from the bending protection layer.

24. The display device of claim 23, wherein the adhesive layer comprises a first side surface closest to the bending region;

the functional layer comprises a second side surface closest to the bending region;

the bending protection layer comprises a third side surface closest to the folding region, the third side surface including a 3-1 side surface facing the first side surface of the adhesive layer and a 3-2 side surface facing the second side surface of the functional layer;

each of the first side surface, the second side surface and the third side surface has a shape in cross-section; and the shape of the second side surface of the functional layer corresponds to the shape of the 3-2 side surface of the bending protection layer.

25. The display device of claim 24, wherein the display device which is folded at the folding region, disposes the first side surface of the adhesive layer aligned with the 3-1 side surface of the bending protection layer, and the second side surface of the functional layer aligned with the 3-2 side surface of the bending protection layer.

26. A display device comprising:

a folding region at which the display device is foldable;

a display panel including a first region corresponding to the folding region, and a bending region extended from the first region and at which the display panel is folded;

a functional layer on the display panel and overlapping the folding region and the first region; and a bending protection layer on the display panel and overlapping the bending region;

wherein the functional layer includes a functional layer side surface facing the bending protection layer, the bending protection layer includes a bending protection layer side surface facing the functional layer side surface, the display device which is folded at the folding region, disposes the bending protection layer side surface contacting the functional layer side surface, and the display device which is unfolded at the folding region, disposes the bending protection layer side surface spaced apart from the functional layer side surface.

27. The display device of claim 26, further comprising an adhesive layer between the display panel and the functional layer, the adhesive layer including an adhesive layer side surface facing the bending protection layer side surface, wherein each of the display device which is folded at the folding region, and the display device which is unfolded at the folding region, disposes the adhesive layer side surface in contact with the bending protection layer side surface.

28. A method for providing a display device, the method comprising:

providing a display panel including a first region corresponding to a folding region of an unfolded display device, and a bending region which is extended from the first region in a first direction and at which the display panel is bent;

providing on the display panel which is bent, in the unfolded display device:

an adhesive layer overlapping the folding region; and a functional layer on the adhesive layer and overlapping the folding region;

folding the display panel which is bent, together with the adhesive layer and the functional layer, at the folding region, to define a folded display device, wherein the folding both:

slides the adhesive layer and the functional layer together with each other, along the display panel, and in the first direction, and disposes each of the adhesive layer and the functional layer which is slid, to include a side surface closest to the bending region;

providing a cured first bending protection resin onto the side surface of the adhesive layer and the side surface of the functional layer, within the folded display device, to provide a bending protection layer of the display device; and unfolding the display panel which is bent, together with the adhesive layer and the functional layer, at the folding region, to provide the display device, wherein the unfolding slides the adhesive layer and the functional layer together with each other, along the display panel, and in a second direction opposite to the first direction.

29. The method of claim 28, wherein the display panel further includes the first region, the bending region and a second region in order in the first direction, the unfolded display device includes each of the adhesive layer and the functional layer having a non-slid side surface which is closest to the bending region, and the providing of the bending protection layer comprises:

before the folding, providing a cured second bending protection resin spaced apart from the non-slid side surfaces of the adhesive layer and the functional layer and extending to the second region, within the unfolded display device, and after the folding, providing the cured first bending protection resin between the cured second bending protection resin, and each of the side surface of the adhesive layer and the side surface of the functional layer, within the folded display device, the cured first bending protection resin having a higher modulus than the cured second bending protection resin.

* * * * *